US010529760B2

(12) United States Patent
Hiyama et al.

(10) Patent No.: US 10,529,760 B2
(45) Date of Patent: *Jan. 7, 2020

(54) SOLID-STATE IMAGING DEVICE, METHOD OF MANUFACTURING THE SAME, AND ELECTRONIC EQUIPMENT

(71) Applicant: Sony Corporation, Tokyo (JP)

(72) Inventors: Susumu Hiyama, Kumamoto (JP); Kazufumi Watanabe, Kumamoto (JP)

(73) Assignee: Sony Cororation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/719,097

(22) Filed: Sep. 28, 2017

(65) Prior Publication Data

US 2018/0019271 A1 Jan. 18, 2018

Related U.S. Application Data

(63) Continuation of application No. 15/591,255, filed on May 10, 2017, now Pat. No. 9,793,307, which is a (Continued)

(30) Foreign Application Priority Data

Mar. 31, 2010 (JP) .................. 2010-082488

(51) Int. Cl.
*H01L 27/146* (2006.01)
(52) U.S. Cl.
CPC ...... *H01L 27/1462* (2013.01); *H01L 27/1463* (2013.01); *H01L 27/1464* (2013.01);
(Continued)

(58) Field of Classification Search
CPC .......... H01L 27/14623; H01L 27/1463; H01L 27/14643; H01L 27/14621; H01L 27/14636; H01L 27/14629
See application file for complete search history.

(56) References Cited

U.S. PATENT DOCUMENTS

2005/0062864 A1* 3/2005 Mabuchi ................ H04N 3/155
                                                                  348/294
2008/0297634 A1* 12/2008 Uya .................. H01L 27/14623
                                                                  348/294
(Continued)

FOREIGN PATENT DOCUMENTS

CN       101409301       4/2009
JP       H11-330440     11/1999
(Continued)

OTHER PUBLICATIONS

Official Action (with English translation) for Chinese Patent Application No. 201510582655.9 dated Sep. 4, 2017, 16 pages.
(Continued)

*Primary Examiner* — Christine A Enad
(74) *Attorney, Agent, or Firm* — Sheridan Ross P.C.

(57) ABSTRACT

A solid state imaging device including a semiconductor layer comprising a plurality of photodiodes, a first antireflection film located over a first surface of the semiconductor layer, a second antireflection film located over the first antireflection film, a light shielding layer having side surfaces which are adjacent to at least one of first and the second antireflection film.

20 Claims, 16 Drawing Sheets

Related U.S. Application Data continuation of application No. 15/426,491, filed on Feb. 7, 2017, now Pat. No. 9,721,985, which is a continuation of application No. 15/084,906, filed on Mar. 30, 2016, now Pat. No. 9,601,539, which is a continuation of application No. 14/204,837, filed on Mar. 11, 2014, now Pat. No. 9,666,632, which is a continuation of application No. 13/865,811, filed on Apr. 18, 2013, now Pat. No. 8,704,324, which is a continuation of application No. 13/070,599, filed on Mar. 24, 2011, now Pat. No. 8,445,985.

(52) U.S. Cl.
CPC .. *H01L 27/14612* (2013.01); *H01L 27/14621* (2013.01); *H01L 27/14623* (2013.01); *H01L 27/14627* (2013.01); *H01L 27/14629* (2013.01); *H01L 27/14636* (2013.01); *H01L 27/14643* (2013.01)

(56) References Cited

U.S. PATENT DOCUMENTS

| | | | | |
|---|---|---|---|---|
| 2009/0159944 A1* | 6/2009 | Oh | ............... | H01L 27/14609 257/292 |
| 2009/0200590 A1* | 8/2009 | Mao | ............... | H01L 27/1463 257/292 |
| 2010/0164031 A1* | 7/2010 | Shin | ............... | H01L 27/14623 257/432 |
| 2010/0201834 A1* | 8/2010 | Maruyama | ............... | H01L 31/18 348/222.1 |
| 2010/0214432 A1* | 8/2010 | Nakata | ............... | H01L 27/14627 348/222.1 |
| 2011/0089514 A1* | 4/2011 | Tay | ............... | H01L 27/14603 257/432 |

FOREIGN PATENT DOCUMENTS

| | | |
|---|---|---|
| JP | 2006-324339 | 11/2006 |
| JP | 2008-306154 | 12/2008 |
| JP | 2009-065098 | 3/2009 |
| JP | 2009-176777 | 8/2009 |
| JP | 2009-277732 | 11/2009 |
| JP | 2010-016114 | 1/2010 |

OTHER PUBLICATIONS

Official Action (with English translation) for Korean Patent Application No. 10-2017-0087646 dated Aug. 15, 2017, 11 pages.
Official Action (no English translation available) for Japanese Patent Application No. 2017-135390, dated May 29, 2018, 19 pages.
Official Action (no English translation available) for Japanese Patent Application No. 2017-135390, dated Dec. 4, 2018, 4 pages.
Official Action (no English translation available) for Japanese Patent Application No. 2017-135390, dated Mar. 28, 2019, 1 page.

* cited by examiner

SOLID-STATE IMAGING DEVICE, METHOD OF MANUFACTURING THE SAME, AND ELECTRONIC EQUIPMENT

CROSS-REFERENCE TO RELATED APPLICATIONS

This application is a continuation of U.S. patent application Ser. No. 15/591,255, filed May 10, 2017, which is a continuation of U.S. patent application Ser. No. 15/426,491, filed Feb. 7, 2017, now U.S. Pat. No. 9,721,985, which is a continuation of U.S. patent application Ser. No. 15/084,906, filed Mar. 30, 2016, now U.S. Pat. No. 9,601,539, which is a continuation of U.S. patent application Ser. No. 14/204,837, filed Mar. 11, 2014, now U.S. Pat. No. 9,666,632, which is a continuation of U.S. patent application Ser. No. 13/865,811, filed Apr. 18, 2013, now U.S. Pat. No. 8,704,324, which is a continuation of U.S. patent application Ser. No. 13/070,599, filed Mar. 24, 2011 now U.S. Pat. No. 8,445,985, which claims priority to Japanese Patent Application JP 2010-082488, filed in the Japan Patent Office on Mar. 31, 2010, the entire disclosures of which are hereby incorporated herein by reference.

BACKGROUND OF THE INVENTION

The present invention relates to a solid-state imaging device, a method of manufacturing the same, and electronic equipment.

Electronic equipment such as a digital video camera and a digital still camera includes a solid-state imaging device. For example, as the solid-state imaging device, a CMOS (Complementary Metal Oxide Semiconductor) type image sensor and a CCD (Charge Coupled Device) type image sensor are included.

In the solid-state imaging device, a plurality of pixels is arranged on a surface of a substrate. In each pixel, a photoelectric conversion portion is provided. The photoelectric conversion portion is, for example, a photo diode, and creates a signal electric charge by receiving an incident light by a light sensing surface to perform the photoelectric conversion.

Among the solid-state imaging devices, in the CMOS type image sensor, the pixels are configured to include a pixel transistor in addition to the photoelectric conversion portion. The pixel transistor is configured to read the signal electric charge created in the photoelectric conversion portion and output the read signal electric charge to a signal line as an electric signal.

In the solid-state imaging device, generally, the photoelectric conversion portion receives the light that is incident from the front surface side on which a circuit element, a wiring or the like is provided on the substrate. In this case, since the circuit element, the wiring or the like shields or reflects the incident light, it is difficult to improve the sensitivity.

For this reason, there is proposed a "rear surface irradiation type" (e.g., see Japanese Unexamined Patent Application Publication Nos. 2003-31785, 2005-347707, 2005-35363, and 2005-353955) in which the photoelectric conversion portion receives the light that is incident from a rear surface side being an opposite side of a front surface on which the circuit element, the wiring or the like is provided in the substrate.

However, in order to suppress an occurrence of dark current due to an interface state of the semiconductor with the photoelectric conversion portion provided thereon, it is disclosed that the photoelectric conversion portion has a HAD (Hole Accumulation Diode) structure. In the HAD structure, by forming a positive electric charge accumulation (hole) accumulation area on the light sensing surface of an n-type of electric charge accumulation area, the occurrence of the dark current is suppressed.

In order to form the positive electric charge accumulation area in an interface portion of the photoelectric conversion portion, it is proposed that, by providing "a film having a negative fixed electric charge" on the light sensing surface of the n-type of electric charge accumulation area and peeling the same, the occurrence of dark current is suppressed. Herein, a high dielectric film having a high refractive index such as a hafnium oxide film (a $HfO_2$ film) is used as a "film having a negative fixed electric charge" to suppress the occurrence of dark current, and the hafnium oxide film is used as an antireflection film to realize the high sensitivity (e.g., see Japanese Unexamined Patent Application Publication No. 2007-258684 (paragraphs 0163 to 0168) and Japanese Unexamined Patent Application Publication No. 2008-306154 (paragraph 0044 or the like)).

SUMMARY

One embodiment consistent with the present invention includes a semiconductor layer comprising a plurality of photodiodes, a first antireflection film located over a first surface of the semiconductor layer, a second antireflection film located over the first antireflection film, a light shielding layer having side surfaces which are adjacent to at least one of first and the second antireflection film.

In another embodiment consistent with the present invention, the light shielding layer is located between the first antireflection film and the second antireflection film.

In another embodiment consistent with the present invention, an intermediate layer located between the first antireflection film and the light shielding layer.

In another embodiment consistent with the present invention, the light shielding layer is embedded in the second antireflection film.

In another embodiment consistent with the present invention a separation region is included between each of the plurality of photodiodes.

In another embodiment consistent with the present invention, the light shielding layer is located over the separation region.

In another embodiment consistent with the present invention, a trench is located in each of the separation regions where the light shielding layer is located inside the trench.

In another embodiment consistent with the present invention, the photodiode has a first surface which receives light.

In another embodiment consistent with the present invention, the first antireflection film and the second antireflection film are located over the first surface of the photodiode.

In another embodiment consistent with the present invention, the thickness of the first antireflection film is smaller than the thickness of the second antireflection film.

In another embodiment consistent with the present invention, the light shielding layer has a substantially convex shape.

In another embodiment consistent with the present invention, the first antireflection film includes at least one of an oxide of hafnium, zirconium, aluminum, tantalum, titanium, magnesium, yttrium, lanthanoid or silicon element.

In another embodiment consistent with the present invention, the second antireflection film includes at least one of an oxide of hafnium, zirconium, aluminum, tantalum, titanium, magnesium, yttrium, lanthanoid or silicon element.

In another embodiment consistent with the present invention, the first antireflection film has a refraction index of 1.5 or more.

In another embodiment consistent with the present invention, the second antireflection film has a refraction index of 1.5 or more In another embodiment consistent with the present invention, the solid state imaging device includes a wiring layer located over a second surface of the semiconductor layer opposite the first antireflection film and the second antireflection film.

In another embodiment consistent with the present invention, the solid state imaging device includes a transistor located over the second surface of the semiconductor layer.

In another embodiment consistent with the present invention, the transistor transfers an electric charge from the photodiode to a transmission line.

Another embodiment consistent with the present embodiment includes a method for manufacturing a solid state imaging device comprising the steps of forming a semiconductor layer comprising a plurality of photodiodes, forming a first antireflection film over a first surface of the semiconductor layer, forming a second antireflection film over the first antireflection film, forming a light shielding layer having side surfaces, where the side surfaces are adjacent to at least one of the first antireflection film and the second antireflection film.

In another embodiment consistent with the present invention, the second antireflection film is formed after forming the light shielding layer.

In another embodiment consistent with the present invention, the light shielding layer is formed after forming the second antireflection film.

In another embodiment consistent with the present invention, the light shielding layer is located between the first antireflection film and the second antireflection film.

In another embodiment consistent with the present invention, the method includes the step of forming an intermediate layer located between the first antireflection film and the light shielding layer.

In another embodiment consistent with the present invention, the light shielding layer is embedded in the second antireflection film.

In another embodiment consistent with the present invention, the method includes the step of forming a separation region between each of the plurality of photodiodes.

In another embodiment consistent with the present invention, the light shielding layer is located over the separation region.

In another embodiment consistent with the present invention, the method includes forming a trench located in each of the separation regions, wherein the light shielding layer is located inside the trench.

In another embodiment consistent with the present invention, the photodiode has a first surface which receives light.

In another embodiment consistent with the present invention, the first antireflection film and the second antireflection film are located over the first surface of the photodiode.

In another embodiment consistent with the present invention, the thickness of the first antireflection film is smaller than the thickness of the second antireflection film.

In another embodiment consistent with the present invention, the light shielding layer has a substantially convex shape.

In another embodiment consistent with the present invention, the first antireflection film includes at least one of an oxide of hafnium, zirconium, aluminum, tantalum, titanium, magnesium, yttrium, lanthanoid or silicon element.

In another embodiment consistent with the present invention, the second antireflection film includes at least one of an oxide of hafnium, zirconium, aluminum, tantalum, titanium, magnesium, yttrium, lanthanoid element or silicon.

In another embodiment consistent with the present invention, the first antireflection film has a refraction index of 1.5 or more.

In another embodiment consistent with the present invention, the second antireflection film has a refraction index of 1.5 or more.

In another embodiment consistent with the present invention, the step of forming a wiring layer over a second surface of the semiconductor layer opposite the first antireflection film and the second antireflection film.

In another embodiment consistent with the present invention, including the steps of forming a transistor over the second surface of the semiconductor layer.

In another embodiment consistent with the present invention, the transistor transfers an electric charge from the photodiode to a transmission line.

Another embodiment consistent with the present invention, an electronic apparatus including a semiconductor layer including a plurality of photodiodes, a first antireflection film on a first surface of the semiconductor layer, a second antireflection film over the first antireflection film, a light shielding layer adjacent the first antireflection film, and a photodiode layer having a side surface adjacent at least the second antireflection film.

In the present invention, the first antireflection film is provided so as to cover the portion in which the light sensing surface and the light shielding layer are provided on the rear surface of the semiconductor layer. Along with this, the second antireflection film is formed on the first antireflection film so as to cover the portion in which the light sensing surface is provided on the rear surface. The light shielding layer 60 is provided not on the second antireflection film but on the first antireflection film.

According to an embodiment of the present invention, it is possible to provide a solid-state imaging device, a method of the manufacturing the same, and electronic equipment capable of improving an image quality or the like of a captured image.

DESCRIPTION OF THE PREFERRED EMBODIMENTS

Embodiments consistent with principles of the present invention will be described with reference to the drawings.

Furthermore, the description will be provided in the following order.

1. First Embodiment (a case of covering an upper surface of a light shielding layer)

2. Second Embodiment (a case of providing an intermediate layer in the case of covering the upper surface of the light shielding layer)

3. Third Embodiment (a case of not covering the upper surface of the light shielding layer)

4. Fourth Embodiment (a light shielding layer embedment type)

Figure 17:
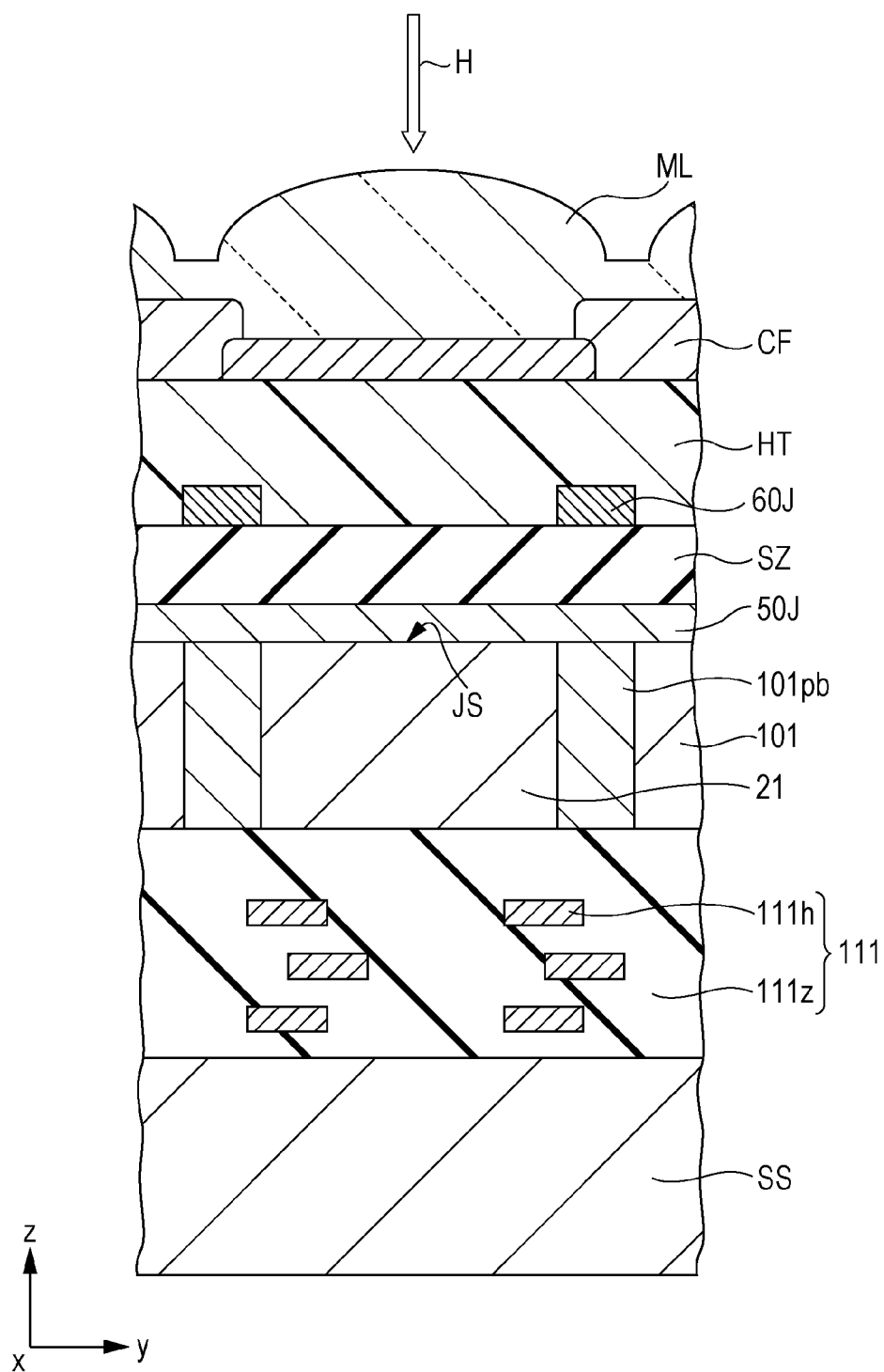
FIG. 17 is a cross-sectional view showing a principal part of a pixel P of a "rear surface irradiation type" of a CMOS image sensor.

FIG. 17 is a cross-sectional view illustrating a principal part of a pixel P of a "rear surface irradiation type" of a CMOS image sensor.

As shown in FIG. 17, in the "rear surface irradiation type" of CMOS image sensor, a photodiode 21 is provided in a portion that is divided by a pixel separation portion 101pb in an inner portion of a semiconductor layer 101.

Although it is not shown in FIG. 17, a pixel transistor is provided on a front surface (a lower surface in FIG. 17) of the semiconductor layer 101, and, as shown in FIG. 17, a wiring layer 111 is provided so as to cover the pixel transistor. In addition, a support substrate SS is provided on the front surface of the wiring layer 111.

Contrary to this, on the rear surface (an upper surface in FIG. 17) of the semiconductor layer 101, an antireflection film 50J, a light shielding layer 60J, a color filter CF, and a micro lens ML are provided, and the photodiode 21 receives the incident light H that is incident via the respective portions.

Herein, as shown in FIG. 17, the antireflection film 50J covers the rear surface (the upper surface) of the semiconductor layer 101. The antireflection film 50J is formed by using a high dielectric having a negative fixed electric charge so that the occurrence of the dark current is suppressed by forming the positive electric charge accumulation (hole) accumulation area on the light sensing surface JS of the photodiode 21. For example, a hafnium oxide film ($HfO_2$ film) is provided as the antireflection film 50J.

As shown in FIG. 17, the light shielding layer 60J is formed on the upper surface of the antireflection film 50J via an interlayer insulation film SZ. Herein, the light shielding layer 60J is provided at an upper part of the pixel separation portion 101pb provided in the inner portion of the semiconductor layer 101.

In addition, the upper surface of the light shielding layer 60J is covered with a planarization film HT, and the color filter CF and the micro lens ML are provided on the upper surface of the planarization film HT. In the color filter CF, for example, each of filter layers of three primary colors are arranged for each pixel P in a Bayer arrangement.

In the case of the above-mentioned structure, since the incident light H, which was incident to one pixel P, is not incident to the photodiode 21 of the one pixel P but penetrates the lower part of the light shielding layer 60J, the incident light H is incident to the photodiode 21 of another adjacent pixel P in some cases. That is, in a case where the incident light H is incident so as to be greatly sloped with respect to a direction z perpendicular to the light sensing surface JS, the incident light H is not incident to the light sensing surface JS immediately below that, but incident to the light sensing surface JS of another pixel P receiving originally the light of another color. For this reason, a so-called "mixed color" is generated, and a color reproducibility declines in the captured color image, whereby the image quality declines.

In this manner, in the case of the above-mentioned configuration, a disadvantage such as "mixed color" occurs by leakage of the inclined light, and therefore, it is difficult to improve the image quality of the captured image.

Thus, it is desirable to provide a solid-state imaging device, a method of manufacturing the same, and electronic equipment that can improve the image quality or the like of the captured image.

1. First Embodiment

Figure 1:
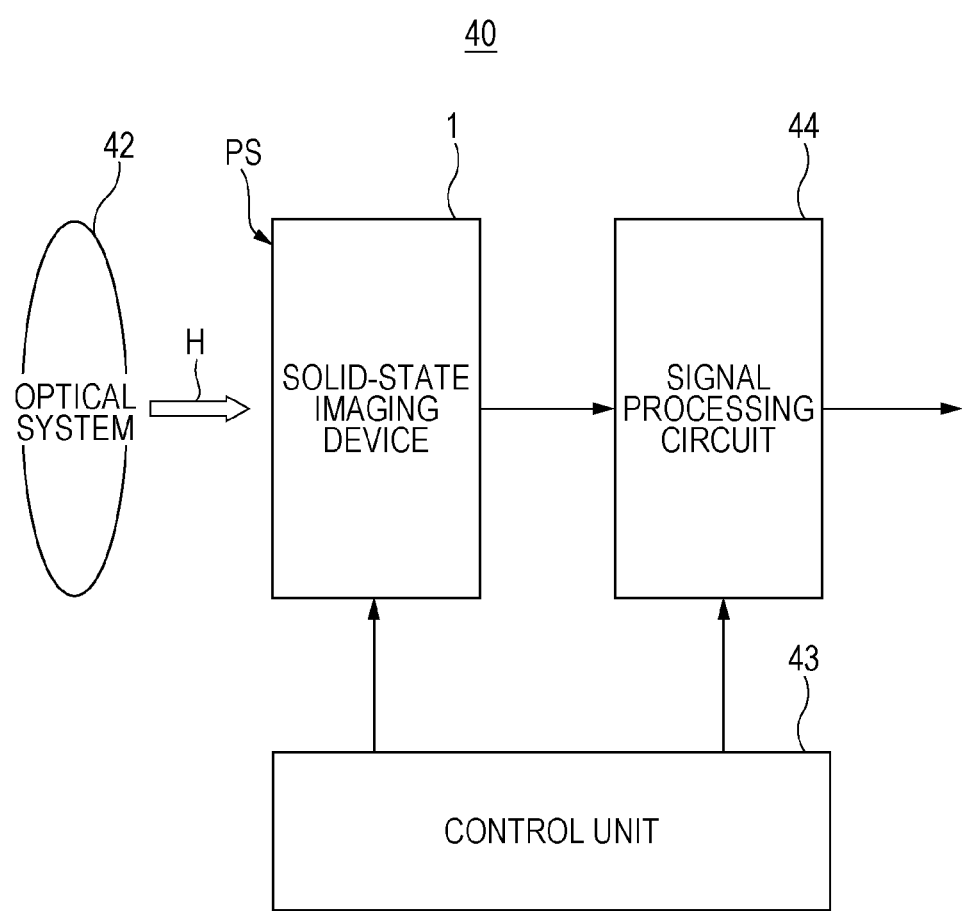
FIG. 1 is a configuration diagram showing a configuration of a camera in a first embodiment according to the present invention.

FIG. 1 is a configuration diagram showing a configuration of a camera 40 in a first embodiment according to the present invention.

As shown in FIG. 1, the camera 40 has a solid-state imaging device 1, an optical system 42, a control portion 43, and a signal processing circuit 44. Each of the portions will be sequentially described.

The solid-state imaging device 1 creates a signal electric charge, by receiving a light H that is incident via an optical system 42 by an imaging surface PS to perform a photoelectric conversion. Herein, the solid-state imaging device 1 is driven based on the control signal that is output from a control portion 43 outputs it as raw data.

The optical system 42 includes an optical member such as an imaging lens or an aperture, and is disposed so as to concentrate the light H due to an incident subject image to an imaging surface PS of the solid-state imaging device 1.

The control portion 43 outputs various control signals to the solid-state imaging device 1 and the signal processing circuit 44, controls and drives the solid-state imaging device 1 and the signal processing circuit 44.

The signal processing circuit 44 is configured so as to create the digital image with respect to the subject image by performing the signal processing with respect to the electric signal that was output from the solid-state imaging device 1.

(1-2) Principal Part Configuration of Solid-State Imaging Device

The overall configuration of the solid-state imaging device 1 will be described.

Figure 2:
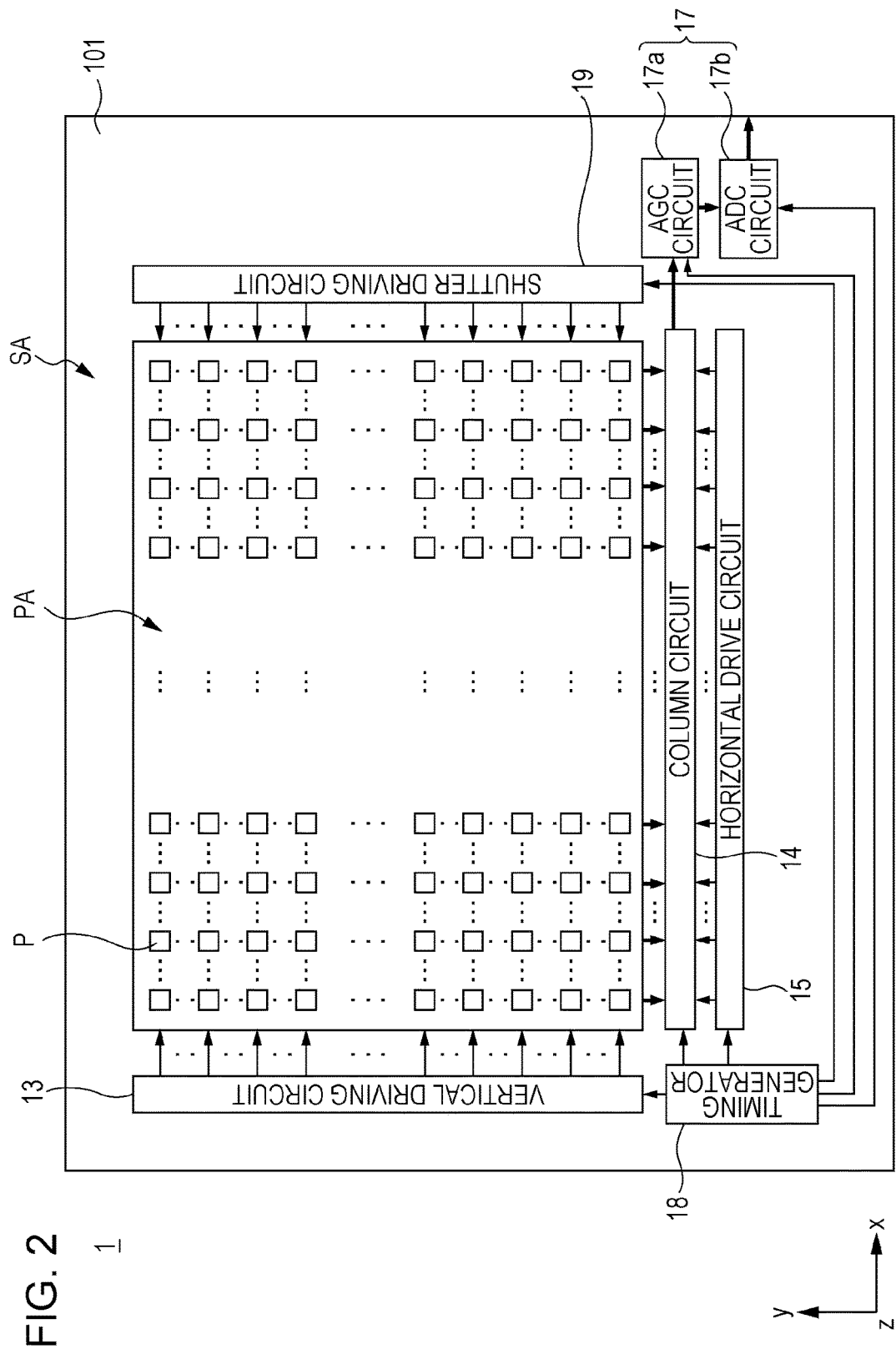
FIG. 2 is a block diagram showing the overall configuration of a solid-state imaging device in the first embodiment according to the present invention.

FIG. 2 is a block diagram showing the overall configuration of the solid-state imaging device 1 in a first embodiment according to the present invention.

The solid-state imaging device 1 of the present embodiment is a CMOS type image sensor and includes a plate-shaped semiconductor layer 101 as shown in FIG. 2. For example, the semiconductor layer 101 is a single crystal silicon semiconductor, and has a pixel area PA and a surrounding area SA provided thereon.

As shown in FIG. 2, the pixel area PA has a rectangular shape, and a plurality of pixels P are disposed in a horizontal direction x and a vertical direction y, respectively. That is, the pixels P are arranged in a line in the shape of a matrix.

In the pixel area PA, each pixel P is configured so as to receive the incident light to create the signal electric charge. In addition, the created signal electric charge is read by a pixel transistor (not shown) and output as the electric signal. The detailed configuration of the pixel P will be described later.

As shown in FIG. 2, the surrounding area SA is situated around the pixel area PA. In addition, a surrounding circuit is provided in the surrounding area SA.

Specifically, as shown in FIG. 2, a vertical drive circuit 13, a column circuit 14, a horizontal drive circuit 15, an external output circuit 17, a timing generator (TG) 18, and a shutter drive circuit 19 are provided as the surrounding circuits.

As shown in FIG. 2, the vertical drive circuit 13 is provided at a side portion of the pixel area PA in the surrounding area SA and configured so as to select and drive the pixels P of the pixel area PA in a line unit.

As shown in FIG. 2, the column circuit 14 is provided at a lower end portion of the pixel area PA in the surrounding area SA and carries out the signal processing with respect to the signal that is output from the pixels P in the line unit. Herein, the column circuit 14 includes a CDS (Correlated Double Sampling) circuit (not shown) and carries out the signal processing that removes the fixed pattern noise.

As shown in FIG. 2, the horizontal drive circuit 15 is electrically connected to the column circuit 14. The horizontal drive circuit 15 includes, for example, a shift register and sequentially outputs the signals, which are maintained for each row of pixels P in the column circuit 14, to the external output circuit 17.

As shown in FIG. 2, the external output circuit 17 is electrically connected to the column circuit 14, carries out the signal processing with respect to the signal that was output from the column circuit 14, and then outputs the signal to the outside. The external output circuit 17 includes an AGC (Automatic Gain Control) circuit 17a and an ADC circuit 17b. In the external output circuit 17, after the AGC circuit 17a applies the gain to the signal, the ADC circuit 17b transforms the signal from an analog signal to a digital signal and the transformed signal output to the outside.

As shown in FIG. 2, the timing generator 18 is electrically connected to each of the vertical drive circuit 13, the column circuit 14, the horizontal drive circuit 15, the external output circuit 17, and the shutter drive circuit 19. The timing generator 18 creates and outputs various timing signals to the vertical drive circuit 13, the column circuit 14, the horizontal drive circuit 15, the external output circuit 17, and the shutter drive circuit 19, thereby carrying out the drive control with respect to each part.

The shutter drive circuit 19 is configured so as to select the pixels P in the line unit and regulate the light exposure time in the pixels P.

(1-3) Detailed Configuration of Solid-State Imaging Device

The detailed content of the solid-state imaging device according to an embodiment of the present invention will be described.

Figure 3:
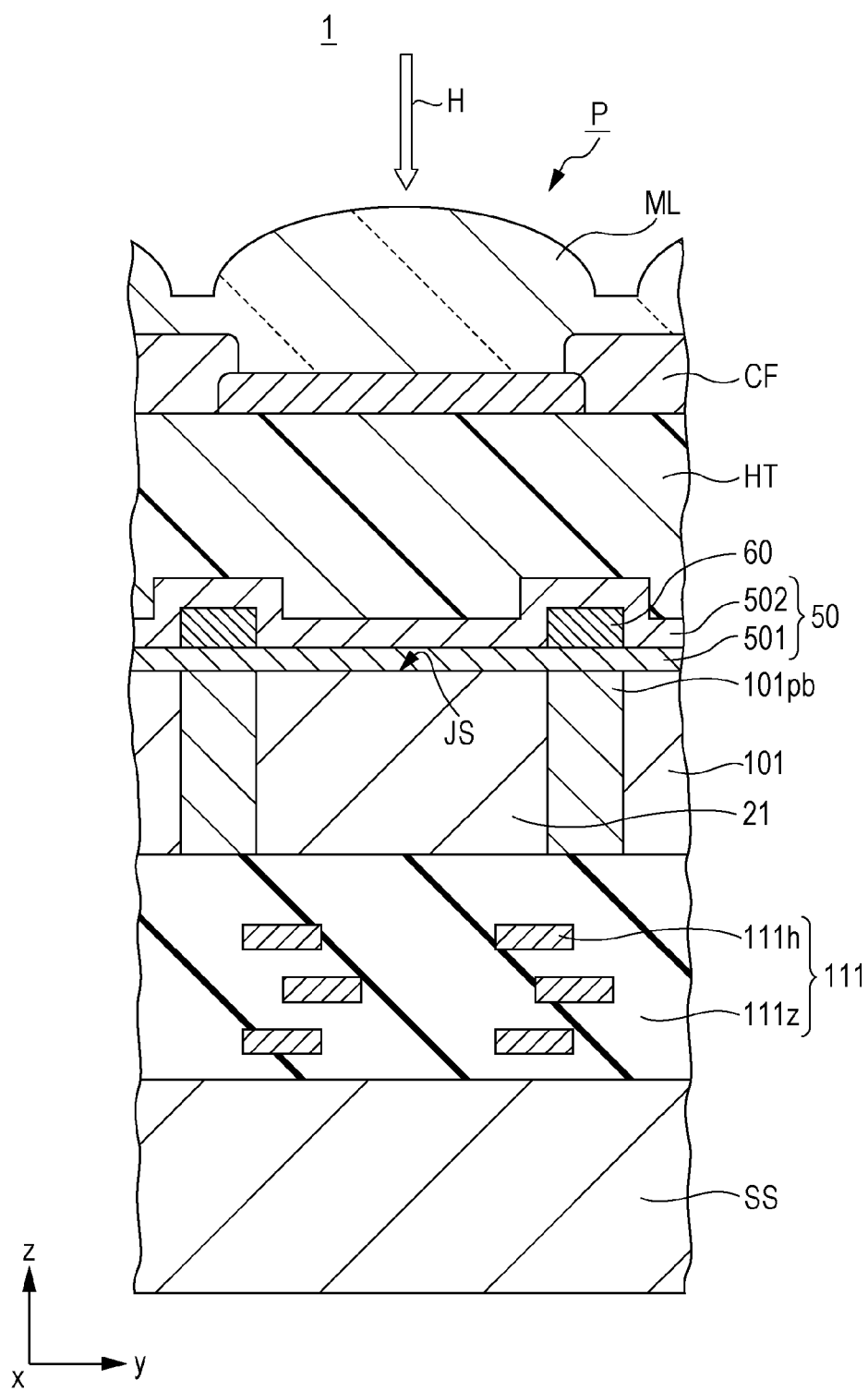
FIG. 3 is a diagram showing a principal part of the solid-state imaging device in the first embodiment according to the present invention.
Figure 4:
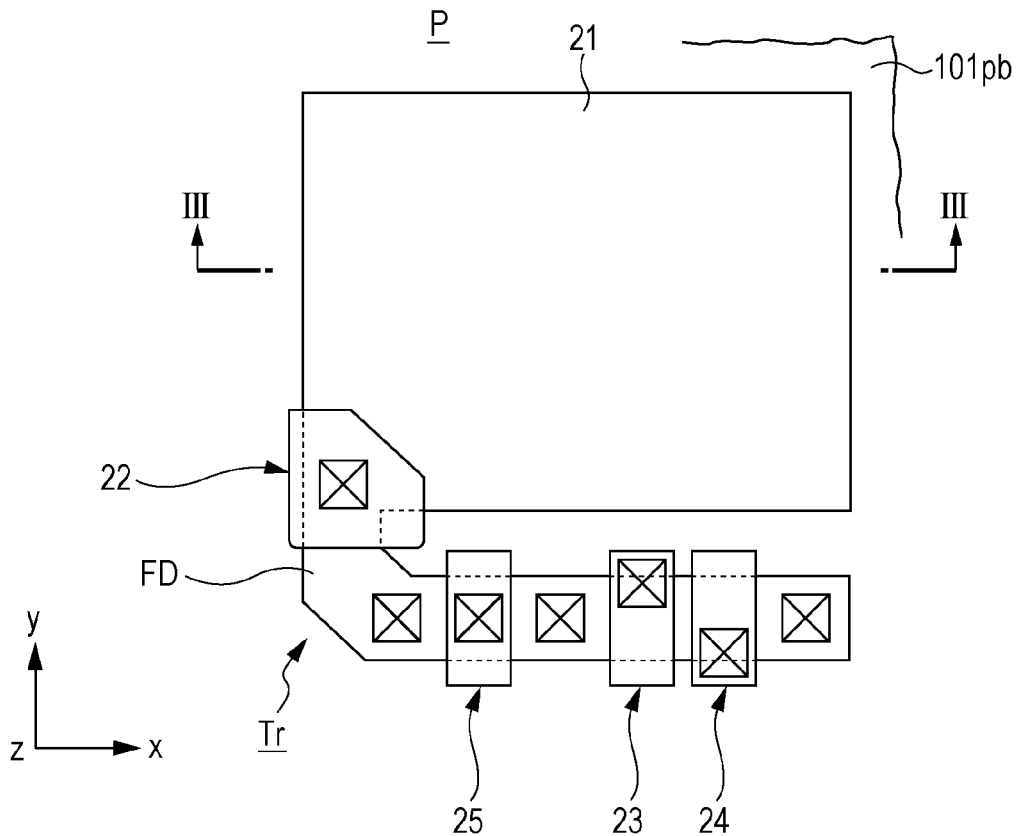
FIG. 4 is a diagram showing a principal part of the solid-state imaging device in the first embodiment according to the present invention.
Figure 5:
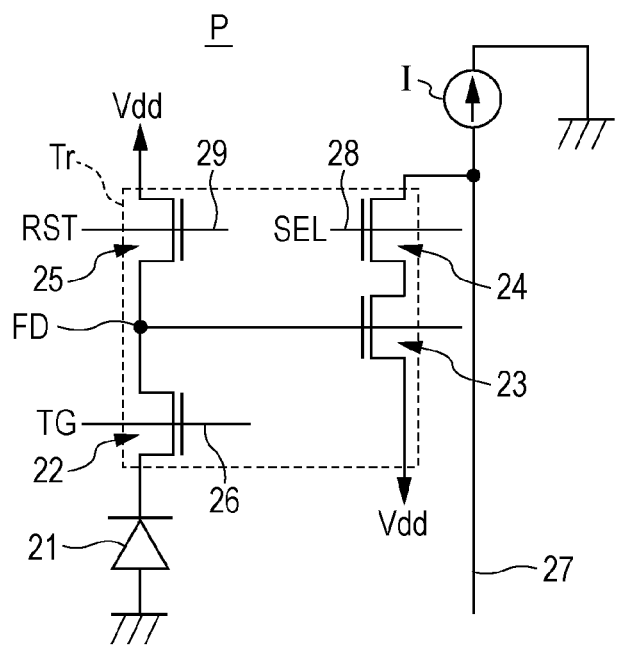
FIG. 5 is a diagram showing a principal part of the solid-state imaging device in the first embodiment according to the present invention.

FIGS. 3 to 5 are diagrams showing a principal part of a solid-state imaging device in a first embodiment according to the present invention.

FIG. 3 is a cross-sectional view of a pixel P. In addition, FIG. 4 is a top plane view of the pixel P formed on the semiconductor substrate. Furthermore, FIG. 5 shows the circuit configuration of the pixel P. Moreover, FIG. 3 shows a cross-section of III-III portion shown in FIG. 4.

As shown in FIG. 3, the solid-state imaging device 1 has a photodiode 21 provided in the inner portion of the semiconductor layer 101. For example, the photodiode 21 is provided on the semiconductor substrate that was thinned to a thickness of about 10 to 20 μm.

On a front surface (a lower surface in FIG. 3) of the semiconductor layer 101, although it is not shown in FIG. 3, a pixel transistor Tr, such as the pixel transistor depicted in FIGS. 4 and 5, is provided. In addition, as shown in FIG. 3, a wiring layer 111 is provided so as to cover the pixel transistor Tr, and a support substrate SS is provided on an opposite surface with respect to the semiconductor layer 101 in the wiring layer 111.

On a rear surface (an upper surface in FIG. 3) of the semiconductor layer 101, an antireflection film 50, a light shielding layer 60, a color filter CF, and a micro lens ML are provided, and the photo diode 21 receives the incident light H is incident from the rear surface side.

Consistent with this embodiment, the solid-state imaging device 1 of the present embodiment is a "rear surface irradiation type CMOS image sensor" and is formed to receive the incident light H at the rear surface (the upper surface in FIG. 3) side being the opposite side of the front surface (the lower surface in FIG. 3) side.

(a) Photodiode 21

In the solid-state imaging device 1, a plurality of the photodiodes 21 are disposed such that each photodiode corresponds to a plurality of pixels P shown in FIG. 2. That is, on the imaging surface (xy surface), a horizontal direction x and a vertical direction y perpendicular to the horizontal direction x are provided in a line, respectively.

The photodiode 21 is configured so as to accumulate the signal electric charge by receiving the incident light H (the subject image) and performing the photoelectric conversion.

Herein, as shown in FIG. 3, the photodiode 21 receives the light incident from the rear surface (the upper surface in FIG. 3) side of the semiconductor layer 101. At an upper part of the photodiode 21, as shown in FIG. 3, the antireflection film 50, the planarization film HT, the color filter CF, and the micro lens ML are provided, and the photodiode 21 receives the incident light H which was sequentially incident via the respective portions and performs the photoelectric conversion.

As shown in FIG. 3, the photodiode 21 is provided in the semiconductor layer 101 as a single crystal silicon semiconductor. Specifically, the photodiode 21 includes an n-type electric charge accumulation area (not shown). In addition, a hole accumulation area (not shown) is formed so as to suppress the occurrence of the dark current in each interface between the upper surface side and the lower surface side of the n type electric charge accumulation area.

As shown in FIG. 3, in an inner portion of the semiconductor layer 101, there is provided a pixel separation portion 101pb in which p type impurities are diffused so as to electrically separate between the plurality of pixels P, and the photodiode 21 is provided at an area partitioned by the pixel separation portion 101pb.

For example, as shown in FIG. 4, the pixel separation portion 101pb is formed so as to be interposed between the plurality of pixels P. That is, the pixel separation portion 101pb is formed so that the plane shape thereof becomes a grid shape, and shown in FIG. 4, the photodiode 21 is formed in the area partitioned by the pixel separation portion 101pb.

In addition, as shown in FIG. 5, each photodiode 21 is configured so that an anode is grounded and the accumulated signal electric charge (herein, electron) is read by the pixel transistor Tr and output to a vertical signal line 27 as the electric signal.

(b) Pixel Transistor Tr

In the solid-state imaging device 1, a plurality of pixel transistors Tr is provided so as to correspond to the plurality of pixels P shown in FIG. 2.

As shown in FIGS. 4 and 5, the pixel transistor Tr includes a transmission transistor 22, an amplification transistor 23, a selection transistor 24, and a reset transistor 25 and is configured to read the signal electric charge from the photodiode 21 and outputs the same as the electric signal. For example, as shown in FIG. 4, the pixel transistor Tr is provided so as to be situated at the lower part of the photodiode 21 in the imaging surface (xy surface).

Each of the transistors 22 to 25 constituting the pixel transistor Tr are not shown in FIG. 3 but are provided on the front surface on which the wiring layer 111 is provided in the semiconductor layer 101. For example, each of the transistors 22 to 25 are provided in the pixel separation portion 101pb that separates between the pixels P in the semiconductor layer 101. For example, each of the transistors 22 to 25 are MOS transistors of N channel, and each gate is formed using, for example, polysilicon. In addition, each of the transistors 22 to 25 is covered with the wiring layer 111.

As shown in FIGS. 4 and 5, in the pixel transistor Tr, the transmission transistor 22 is configured so as to transmit the signal electric charge created in the photodiode 21 to a floating and diffusion FD.

Specifically, as shown in FIGS. 4 and 5, the transmission transistor 22 is provided between a cathode of the photodiode 21 and the floating and diffusion FD. In addition, in the transmission transistor 22, the transmission line 26 is electrically connected to the gate. In the transmission transistor 22, the transmission signal TG is given from the transmission line 26 to the gate, thereby transmitting the signal electric charge accumulated in the photodiode 21 to the floating and diffusion FD.

As shown in FIGS. 4 and 5, in the pixel transistor Tr, the amplification transistor 23 is configured so as to amplify and output the electric signal which was transformed from the electric charge to the voltage in the floating and diffusion FD.

Specifically, as shown in FIG. 4, the amplification transistor 23 is provided between the selection transistor 24 and the reset transistor 25. Herein, as shown in FIG. 5, in the amplification transistor 23, the gate is electrically connected to the floating and diffusion FD. Furthermore, in the amplification transistor 23, the drain is electrically connected to a power supply line Vdd and the source is electrically connected to the selection transistor 24. When the selection transistor 24 is selected to become in the ON state, the amplification transistor 23 is supplied with the constant current from a constant electric source I and operated as a source follower. For this reason, in the amplification transistor 23, the selection signal is supplied to the selection transistor 24, whereby the electric signal, which was transformed from the electric charge to the voltage, is amplified in the floating and diffusion FD.

In the pixel transistor Tr, the selection transistor 24 is configured to output the electric signal, which was output by the amplification transistor 23, to the vertical signal line 27 when the selection signal is input, as shown in FIGS. 4 and 5.

Specifically, as shown in FIG. 4, the selection transistor 24 is provided so as to be close to the amplification transistor 23. Furthermore, as shown in FIG. 5, in the selection transistor 24, the gate is connected to an address line 28 that is supplied with the selection signal. In addition, the selection transistor 24 enters the ON state upon being supplied with the selection signal, and outputs the output signal amplified by the amplification transistor 23 as above to the vertical signal line 27.

In the pixel transistor Tr, as shown in FIGS. 4 and 5, the reset transistor 25 is configured so as to reset the gate electric potential of the amplification transistor 23.

Specifically, as shown in FIG. 4, the reset transistor 25 is provided so as to be close to the amplification transistor 23. As shown in FIG. 5, in the reset transistor 25, the gate is electrically connected to a reset line 29 that is provided with the reset signal. Moreover, in the reset transistor 25, the drain is electrically connected to the electric power supply line Vdd and the source is electrically connected to the floating and diffusion FD. In addition, when the reset signal is supplied from the reset line 29 to the gate, the reset transistor 25 resets the gate electric potential of the amplification transistor 23 to the power supply voltage via the floating and diffusion FD.

In the above, the transmission line 26, the address line 28, and the reset line 29 are wired so as to be connected to the gates of the respective transistors 22, 24, and 25 of the plurality of pixels P arranged in the horizontal direction H (a line direction). For this reason, the operations of the respective transistors 22, 23, 24, and 25 are concurrently performed with respect to the pixels P of one line.

(c) Wiring Layer 111

In the solid-state imaging device 1, as shown in FIG. 3, the wiring layer 111 is provided on the front surface (the lower surface in FIG. 3) being the opposite side of the rear surface (the upper surface in FIG. 3) on which each part such as the antireflection film 50 is provided in the semiconductor layer 101.

The wiring layer 111 includes a wiring 111h and an insulation layer 111z, and is configured so that the wiring 111h is electrically connected to each element in the insulation layer 111z. Herein, each wiring 111h is stacked and formed in the insulation layer 111z so as to function as each wiring such as the transmission line 26, the address line 28, the vertical signal line 27, and the reset line 29, which are shown in FIG. 5.

In addition, in the wiring layer 111, on the surface of the opposite side of the side where the semiconductor layer 101 is situated, the support substrate SS is provided. For example, the substrate formed of the silicon semiconductor having the thickness of several hundred μm is provided as the support substrate SS.

(d) Antireflection Film 50

In the solid-state imaging device 1, as shown in FIG. 3, the antireflection film 50 is provided on the rear surface (the upper surface in FIG. 3) being the opposite side of the front surface (the lower surface in FIG. 3) whereby each part such as the wiring layer 111 is provided in the semiconductor layer 101.

As shown in FIG. 3, the antireflection film 50 includes a first antireflection film 501 and a second antireflection film 502 and is configured so as to prevent the light H incident from the rear surface side of the semiconductor layer 101 from being reflected in the rear surface of the semiconductor layer 101. That is, the material and the film thickness of the antireflection film 50 are suitably selected and formed so that the antireflection function is manifested by the optical interference action. Herein, it is desirable to form the antireflection film 50 using a material having a high refractive index. Particularly, it is desirable to form the antireflection film 50 using a material having the refractive index of 1.5 or more. In another embodiment, the antireflection film is comprised of the first antireflection film 501 which has a antireflection index of 1.5 or more. In another embodiment, each of the first antireflection film 501 and the second antireflection film 502 has a antireflection index of 1.5 or more.

In the antireflection film 50, as shown in FIG. 3, the first antireflection film 501 is formed so as to cover the rear surface (the upper surface) of the semiconductor layer 101.

Specifically, as shown in FIG. 3, the first antireflection film 501 is provided so as to cover the portion where the photodiode 21 is formed and the portion where the pixel separation portion 101pb is formed in the rear surface of the semiconductor layer 101. Herein, the first antireflection film 501 is provided so as to have a constant thickness along a flat rear surface of the semiconductor layer 101.

In the present embodiment, the first antireflection film 501 is formed to have a film thickness thinner than that of the second antireflection film 502.

Furthermore, the first antireflection film 501 is formed using a high dielectric having a negative fixed electric charge so that the occurrence of the dark current is suppressed by forming a positive electric charge accumulation (hole) accumulation area on the light sensing surface JS of the photodiode 21. The first antireflection film 501 is formed to include at least one of oxide of hafnium, zirconium, aluminum, tantalum, titanium, magnesium, yttrium, lanthanoid, silicon element or the like. By forming the first antireflection film 501 to have the negative fixed electric charge, the electric field is added to an interface between it and the photodiode 21 by the negative fixed electric charge, and thus, the positive electric charge accumulation (hole) accumulation area is formed.

For example, the hafnium oxide film ($HfO_2$ film) subjected to the film formation to have a film thickness of 1 to 20 nm is provided as the first antireflection film 501.

In the antireflection film 50, as shown in FIG. 3, the second antireflection film 502 is formed so as to cover the rear surface (the upper surface) of the semiconductor layer 101 via at least one of the first antireflection film 501 and the light shielding layer 60. The second antireflection film 502 may be formed to include at least one of oxide of hafnium, zirconium, aluminum, tantalum, titanium, magnesium, yttrium, lanthanoid, silicon element or the like.

Specifically, as shown in FIG. 3, in the portion where the photodiode 21 is formed on the rear surface of the semiconductor layer 101, the second antireflection film 502 is provided so that the first antireflection film 501 is interposed between it and the semiconductor layer 101.

Furthermore, in the portion where the pixel separation portion 101pb is formed in the rear surface of the semiconductor layer 101, the second antireflection film 502 is provided so that both of the first antireflection film 501 and the light shielding layer 60 are interposed between it and the semiconductor layer 101. Herein, the light shielding layer 60 is provided in the portion where the pixel separation portion 101pb is provided in the semiconductor layer 101, among the upper surface of the first antireflection film 501, and the second antireflection film 502 is provided on the upper surface of the first antireflection film 501 so as to cover the light shielding layer 60. That is, the light shielding layer 60 having a convex shape is provided on the flat surface of the first antireflection film 501, concave and convex surfaces are provided, and the second antireflection film 502 is provided so as to follow the concave and convex surface in a constant thickness.

In the present embodiment, the second antireflection film 502 is formed to have a film thickness thicker than that of the first antireflection film 501.

For example, the hafnium oxide film ($HfO_2$ film) subjected to the film formation so that the film thickness totaled with the first antireflection film 501 becomes 40 to 80 nm is formed as the second antireflection film 502.

Regarding the first antireflection film 501 and the second antireflection film 502, various materials can be used besides the above-mentioned hafnium oxide film ($HfO_2$ film).

Herein, it is desirable to form the first antireflection film 501 using a material having a flat band voltage higher than the silicon oxide film ($SiO_2$ film).

For example, it is desirable to form the first antireflection film 501 using a high dielectric material (High-k) as follows. In addition, in the following description, $\Delta Vfb$ refers to the value that subtracts the flat band voltage Vfb ($SiO_2$) of $SiO_2$ from the flat band voltage Vfb (High-k) of the High-k material (that is, $\Delta Vfb = Vfb$ (High-k)-Vfb ($SiO_2$)).

$Al_2O_3$ ($\Delta Vfb$=4 to 6V)
$HfO_2$ ($\Delta Vfb$=2 to 3V)
$ZrO_2$ ($\Delta Vfb$=2 to 3V)
$TiO_2$ ($\Delta Vfb$=3 to 4V)
$Ta_2O_5$ ($\Delta Vfb$=3 to 4V)
$MgO_2$ ($\Delta Vfb$=1.5 to 2.5V)

Furthermore, besides the above materials, it is desirable to form the second antireflection film 502 using the following material.

SiN
SiON

In the above, the description has been given of the case where the hafnium oxide film ($HfO_2$ film) is used in regard to both of the first antireflection film 501 and the second antireflection film 502, the present invention is not limited thereto. The above-mentioned various materials can be suitably combined and used.

For example, it is desirable to form the first antireflection film 501 and the second antireflection film 502 by the combination of the materials shown below. In the following description, the left side refers to the material used upon forming the first antireflection film 501 and the right side refers to the material used upon forming the second antireflection film 502.

(The material of the first antireflection film 501 and the material of the second antireflection film 502)

($HfO_2$, $HfO_2$)
($HfO_2$, $Ta_2O_5$)
($HfO_2$, $Al_2O_3$)
($HfO_2$, $ZrO_2$)
($HfO_2$, $TiO_2$)
($MgO_2$, $HfO_2$)
($Al_2O_3$, $SiN$)
($HfO_2$, $SiON$)

(e) Light Shielding Layer 60

In the solid-state imaging device 1, as shown in FIG. 3, the light shielding layer 60 is provided at the side of the rear surface (the upper surface in FIG. 3) of the semiconductor layer 101.

The light shielding layer 60 is configured so as to shield a part of the incident light H facing from the upper part of the semiconductor layer 101 to the rear surface of the semiconductor layer 101.

As shown in FIG. 3, the light shielding layer 60 is provided in the upper part of the pixel separation portion 101pb provided in the inner portion of the semiconductor layer 101. Contrary to this, in the upper part of the photodiode 21 provided in the inner portion of the semiconductor layer 101, the light shielding layer 60 is not provided but opened so that the incident light H is incident to the photodiode 21.

That is, although it is not shown in FIG. 4, the light shielding layer 60 is formed so that the plane shape thereof becomes a grid shape in the same manner as the pixel separation portion 101pb.

In the present embodiment, as shown in FIG. 3, the light shielding layer 60 is provided to protrude in a convex shape on the upper surface of the first antireflection film 501. In addition, the light shielding layer 60 is provided so that the upper surface thereof is covered with the second antireflection film 502 and the convex-shaped side portion comes into contact with the second antireflection film 502.

The light shielding layer 60 is formed of a light shielding material that shields the light. For example, a tungsten (W) film which was subjected to the film formation to have a film thickness of 100 to 400 nm is formed as the light shielding layer 60. In addition, it is also desirable to form the light shielding layer 60 by stacking a titanium nitride (TiN) film and the tungsten (W) film.

(f) The Rest

In addition, as shown in FIG. 3, in the rear surface side of the semiconductor layer 101, a planarization film HT is provided on the upper surface of the antireflection film 50. On the upper surface of the planarization film HT, a color filter CF and a micro lens ML are provided.

For example, the color filter CF includes a red filter layer (not shown), a green filter layer (not shown), and a blue filter layer (not shown), and each filter layer of the three primary colors is disposed to correspond to each pixel P in a Bayer arrangement. That is, the color filter CF is configured so that different colors of lights penetrate therethrough between the pixels P arranged adjacently to each other in the horizontal direction x and the vertical direction y.

A plurality of micro lenses ML is disposed to correspond to each pixel P. The micro lens ML is a convex lens protruding in the convex shape in the rear surface side of the semiconductor layer 101 and is configured to concentrate the incident light H in the photodiode 21 of each pixel P. For example, the micro lens ML is formed using an organic material such as resin.

(2) Manufacturing Method

A principal part of a method of manufacturing the solid-state imaging device 1 will be described.

FIGS. 6 to 10 show a method of manufacturing a solid-state imaging device in a first embodiment according to the present invention.

FIGS. 6 to 10 show cross-sections similarly to FIG. 3. The solid-state imaging device 1 shown in FIG. 3 or the like is manufactured sequentially via the processes shown in each drawing.

(2-1) Formation of the Photodiode 21 or the Like

Figure 6:
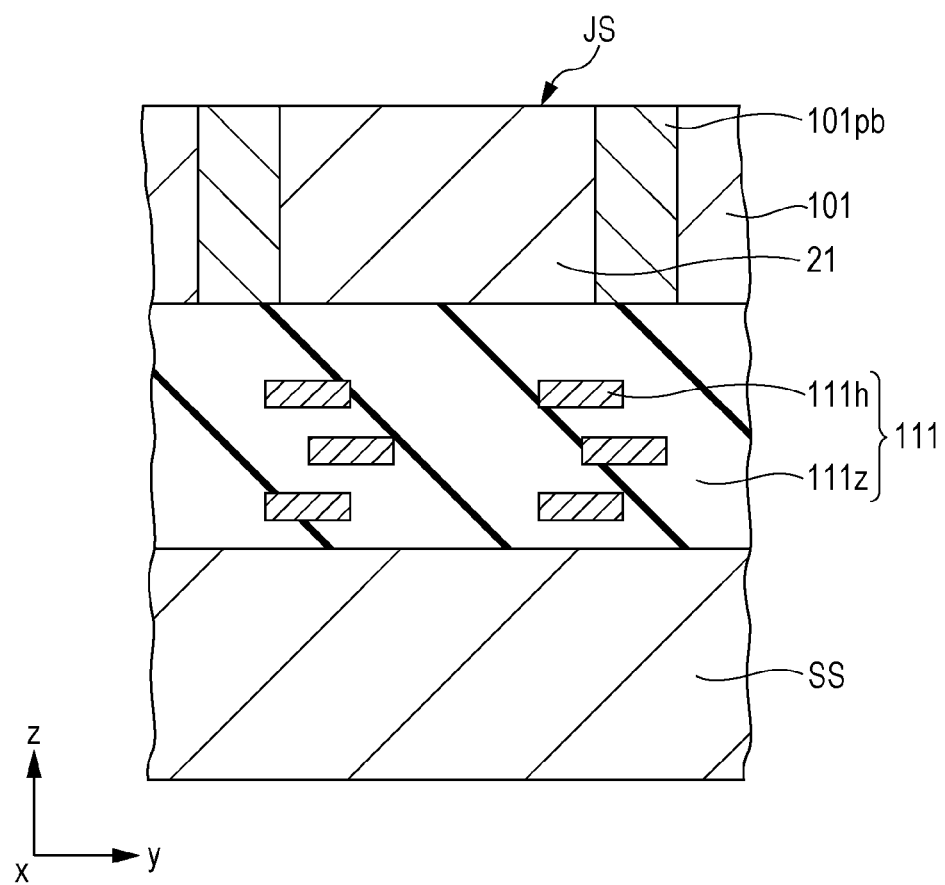
FIG. 6 is a diagram showing a method of manufacturing the solid-state imaging device in the first embodiment according to the present invention.

Firstly, as shown in FIG. 6, the photodiode 21 or the like is formed.

Herein, by performing the ion implantation of impurities from the front surface of the semiconductor substrate formed of a single crystal silicon semiconductor, the photodiode 21 and the pixel separation portion 101pb are formed. In addition, after forming the pixel transistor Tr (shown in FIG. 6) on the front surface of the semiconductor substrate, the wiring layer 111 is formed so as to cover the pixel transistor Tr. In addition, the support substrate SS is attached to the front surface of the wiring layer 111.

Next, by thinning the semiconductor substrate to have, for example, the thickness of about 10 to 20 μm, the above-mentioned semiconductor layer 101 is formed. For example, the thinning is carried out by polishing the semiconductor substrate according to the CMP method.

(2-2) Formation of First Antireflection Film 501

Figure 7:
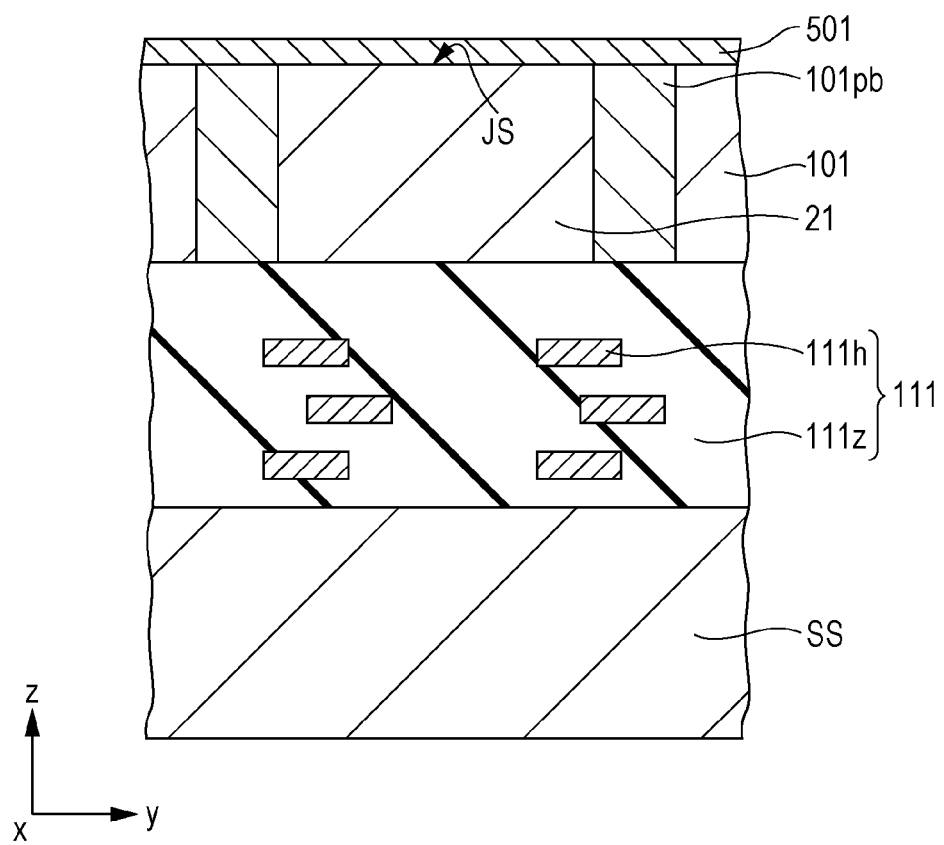
FIG. 7 is a diagram showing a method of manufacturing the solid-state imaging device in the first embodiment according to the present invention.

Next, as shown in FIG. 7, the first antireflection film 501 is formed.

Herein, as shown in FIG. 7, the first antireflection film 501 is formed to cover the rear surface (the upper surface) of the semiconductor layer 101.

Specifically, as shown in FIG. 3, on the rear surface of the semiconductor layer 101, the first antireflection film 501 is provided so as to cover the portion where the photodiode 21 is formed and the portion where the pixel separation portion 101pb is formed.

For example, by forming the hafnium oxide film ($HfO_2$ film) to have a film thickness of 1 to 20 nm under the condition of the film formation temperature of 200 to 300° C. by an ALD (Atomic Layer Deposition) method, the first antireflection film 501 is provided.

(2-3) Formation of Light Shielding Layer 60

Figure 8:
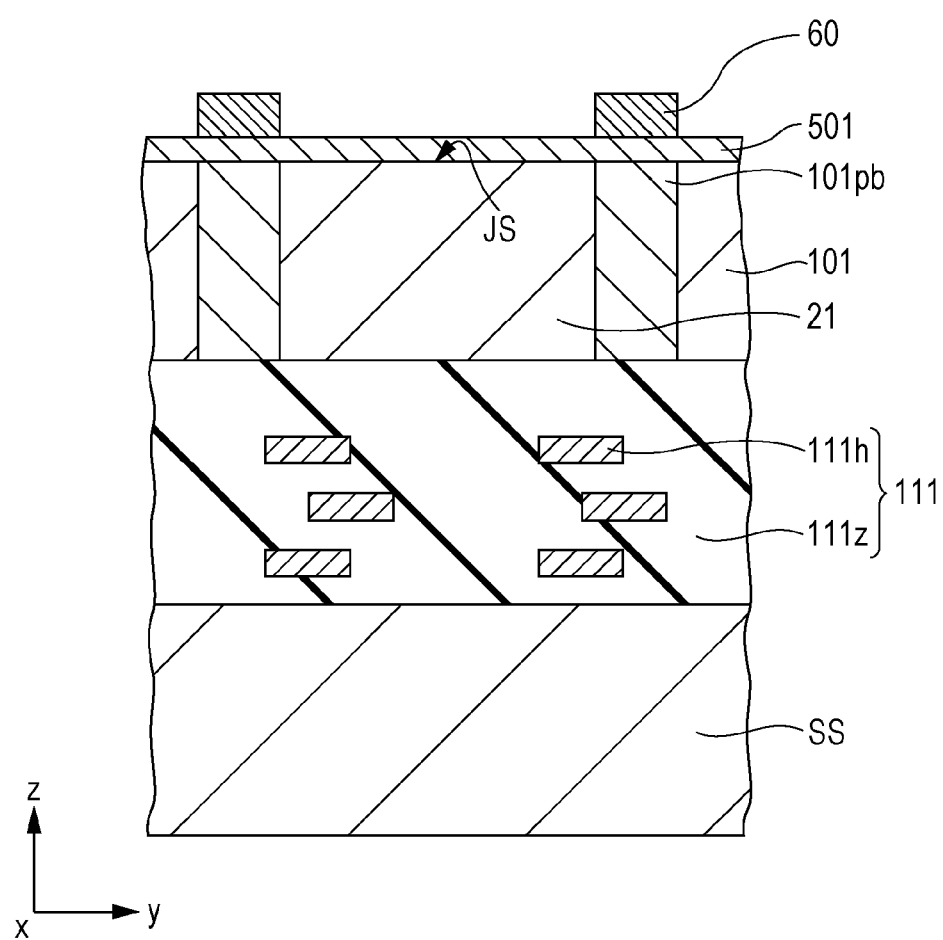
FIG. 8 is a diagram showing a method of manufacturing the solid-state imaging device in the first embodiment according to the present invention.

Next, as shown in FIG. 8, the light shielding layer 60 is formed.

Herein, as shown in FIG. 8, the light shielding layer 60 is formed on the upper surface of the first antireflection film 501 so as to be situated at the upper part of the pixel separation portion 101pb provided in the inner portion of the semiconductor layer 101.

For example, after the tungsten (W) film (not shown) is formed on the upper surface of the first antireflection film 501 to have a film thickness of 100 to 400 nm by the sputtering method, the light shielding layer 60 is formed by performing the pattern working to the tungsten film. Specifically, by performing the dry etching processing, the light shielding layer 60 is formed from the tungsten film.

(2-4) Formation of the Second Antireflection Film 502

Figure 9:
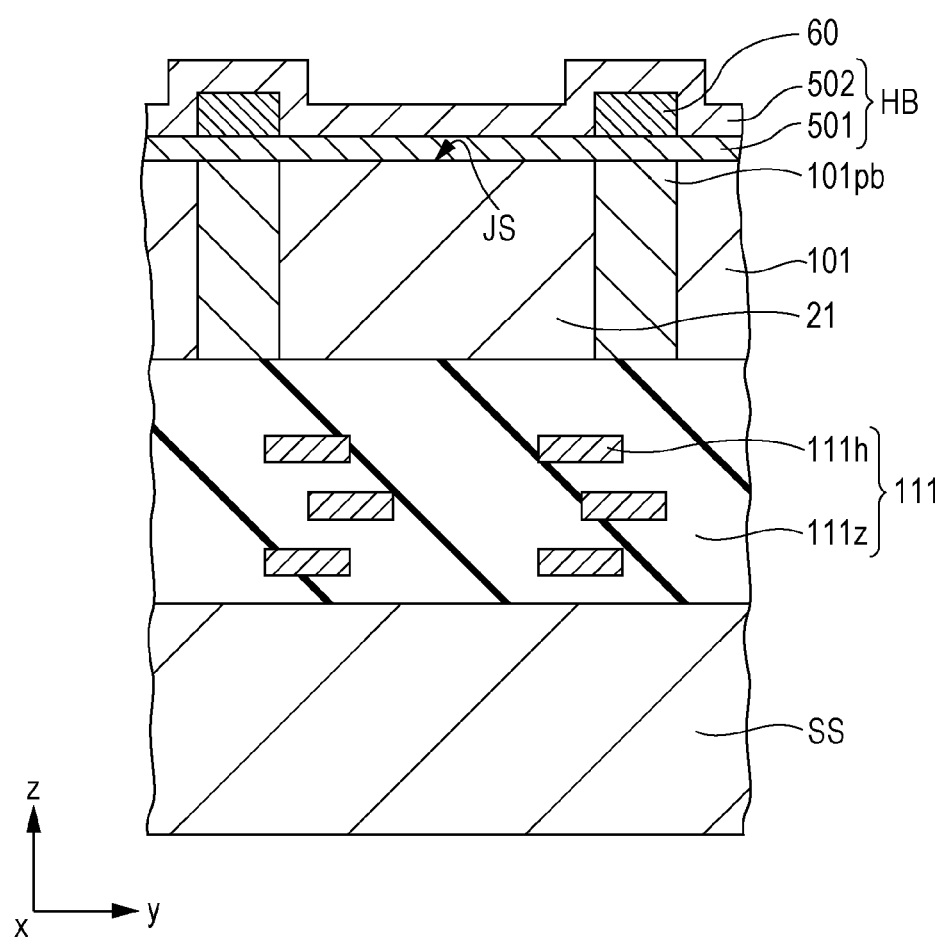
FIG. 9 is a diagram showing a method of manufacturing the solid-state imaging device in the first embodiment according to the present invention.

Next, as shown in FIG. 9, the second antireflection film 502 is formed.

Herein, as shown in FIG. 9, the second antireflection film 502 is formed so that the second antireflection film 502 covers the rear surface (the upper surface) of the semiconductor layer 101 via at least one of the first antireflection film 501 and the light shielding layer 60.

Specifically, as shown in FIG. 9, the second antireflection film 502 is formed so that the first antireflection film 501 is interposed in the formation portion of the photodiode 21 and both of the first antireflection film 501 and the light shielding layer 60 are interposed in the formation portion of the pixel separation portion 101pb.

For example, by forming the hafnium oxide film ($HfO_2$ film) by a physical vapor deposition (PVD) method so that the total film thickness with the first antireflection film 501 becomes 40 to 80 nm, the second antireflection film 502 is formed. The film formation according to the PVD method has the film forming velocity higher than that of the ALD method, so that the thick film can be formed within a short time.

(2-5) Formation of the Planarization Film HT

Figure 10:
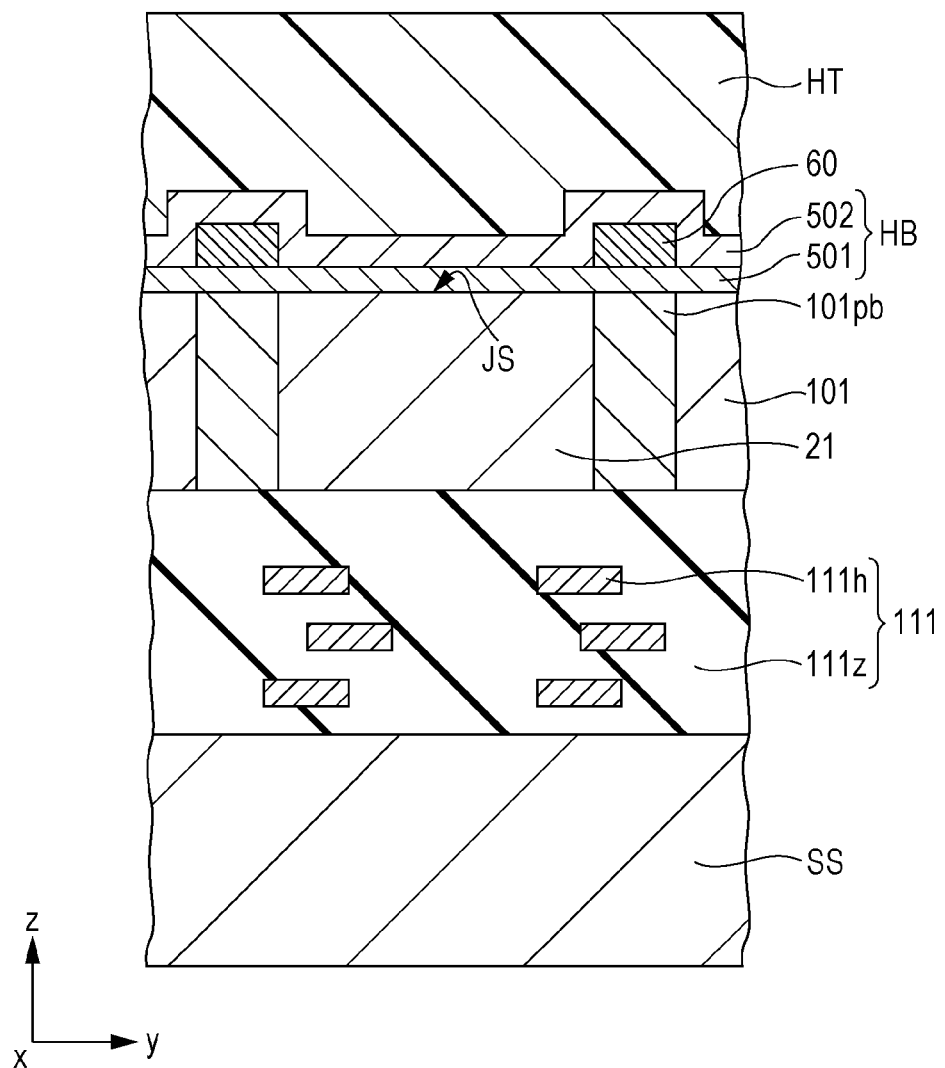
FIG. 10 is a diagram showing a method of manufacturing the solid-state imaging device in the first embodiment according to the present invention.

Next, as shown in FIG. 10, the planarization film HT is formed.

Herein, as shown in FIG. 10, the planarization film HT is formed so that the upper surface thereof is flat on the second antireflection film 502.

For example, by coating an organic material such as resin by the spin coat method, the planarization film HT is formed.

Next, as shown in FIG. 3, at the rear surface side of the semiconductor layer 101, the color filter CF and the micro lens ML are provided. By doing this, a rear surface irradiation type of CMOS type image sensor is completed.

(3) Conclusion

As described above, in the present embodiment, a plurality of photodiodes 21 that receives the incident light H by the light sensing surface JS is provided in the inner portion of the semiconductor layer 101 to correspond to the plurality of pixels P. In addition, at the rear surface (the upper surface) side to which the incident light H is incident in the semiconductor layer 101, the antireflection film 50 that prevents the reflection of the incident light H is provided. Furthermore, at the rear surface side of the semiconductor layer 101, there is provided the light shielding layer 60 where an opening through which the incident light H passes to the light sensing surface JS is formed.

Herein, the antireflection film 50 includes a plurality of films of the first antireflection film 501, the second antireflection film 502, and the first antireflection film 501 is provided to cover the portion where the light sensing surface JS and the light shielding layer 60 are provided on the rear surface. Along with this, in the antireflection film 50, the second antireflection film 502 is formed on the first antireflection film 501 so as to cover the portion where the light sensing surface JS is provided on the rear surface. The first antireflection film 501 has a film thickness thinner than that of the second antireflection film 502. In addition, the light shielding layer 60 is not provided on the second antireflection film 502 but is provided on the first antireflection film 501 (see FIG. 3).

In this manner, in the present embodiment, only the thin first antireflection film 501 is provided between the semiconductor layer 101 and the light shielding layer 60. For this reason, it is possible to suppress the incident light H from penetrating the lower portion of the light shielding layer 60, whereby the incident light H incident to the pixel P can be prevented from being incident to the photodiode 21 of the adjacent different pixel P. That is, the incident light H is incident to the immediately lower light sensing surface JS, whereby it is possible to prevent the incident light from being incident to the light sensing surface JS of the different pixel P that receives the other color of light.

Thus, in the present embodiment, it is possible to prevent the "mixed color" from occurring to improve the color reproducibility in the captured color image.

Thus, the present embodiment can improve the image quality.

Moreover, in the present embodiment, the first antireflection film 501 is formed using the high dielectric having the negative fixed electric charge. For this reason, since the positive electric charge accumulation (hole) accumulation area is formed on the light sensing surface JS of the photodiode 21, the occurrence of the dark current can be prevented.

Furthermore, in the present embodiment, the antireflection film 50 is formed using a material having the refractive index of 1.5 or more. For this reason, since the refractive index difference between it and silicon (Si) decreases, the effect of the antireflection on the light sensing surface of silicon can be obtained. Particularly, it is desirable to use a material having the refractive index of the intermediate refractive index between the refractive index (3.6) of Si of the lower layer and the refractive index (1.45) of $SiO_2$ of the upper layer. Specifically, it is desirable to form the antireflection film 50 using the SiN film (the refractive index is about 2). Besides, a high refractive film (the refractive index is about 2.5) such as $TiO_2$. Thus, it is desirable to form the antireflection film 50 using a material having the refractive index of 1.5 or more and 2.6 or less.

Furthermore, in the present embodiment, the first antireflection film 501 is formed by the ALD method. For this reason, since a satisfactory silicon interface having the small interface state can be formed, the effect of the dark current reduction can be obtained.

2. Second Embodiment (1) Device Configuration or the Like

Figure 11:
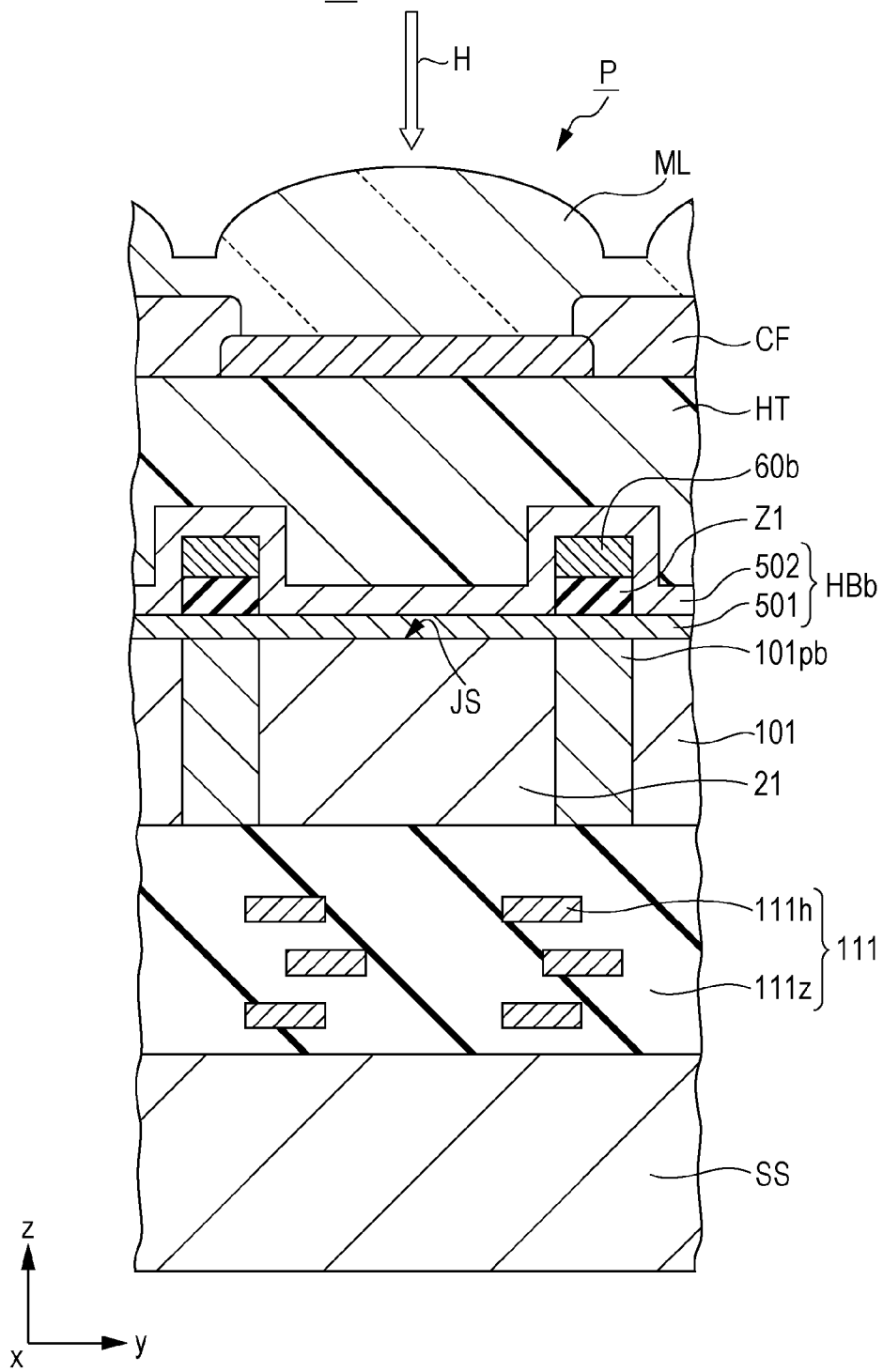
FIG. 11 is a diagram showing a principal part of a solid-state imaging device in a second embodiment according to the present invention.

FIG. 11 is a drawing showing a principal part of a solid-state imaging device 1b in a second embodiment according to the present invention.

FIG. 11 shows the cross-section of the pixel P similarly to FIG. 3.

As shown in FIG. 11, in the present embodiment, an insulation film Z1 is provided. Along with this, a material of a light shielding layer 60b is different from that of the first embodiment. Except for this point, the present embodiment is the same as the first embodiment. For this reason, description of the overlapped portion will be omitted.

In the present embodiment, unlike the case of the first embodiment, the light shielding layer 60b is formed using the Titanium (Ti) film.

Titanium film has a superior close-contact property but has a strong reduction action.

In a case where the titanium film is directly formed as the light shielding layer 60b on the hafnium oxide film ($HfO_2$ film) formed as the first antireflection film 501, the reaction occurs between both of the films. For this reason, in this case, it is difficult to effectively suppress occurrence of the dark current due to the interface state in some cases.

In order to prevent the occurrence of this disadvantage, in the present embodiment, as shown in FIG. 11, the insulation film Z1 is provided as an intermediate layer between the hafnium oxide film ($HfO_2$ film) formed as the first antireflection film 501 and the titanium film formed as the light shielding layer 60b.

That is, in the present embodiment, the insulation film Z1 is formed using a material in which the reaction between it and the first antireflection film 501 hardly occurs compared to the light shielding layer 60*b*.

For example, the insulation film Z1 is the silicon oxide film and is formed to have a film thickness of 10 nm to 50 nm.

(2) Manufacturing Method

A principal part of a method of manufacturing the solid-state imaging device will be described.

Figure 12:
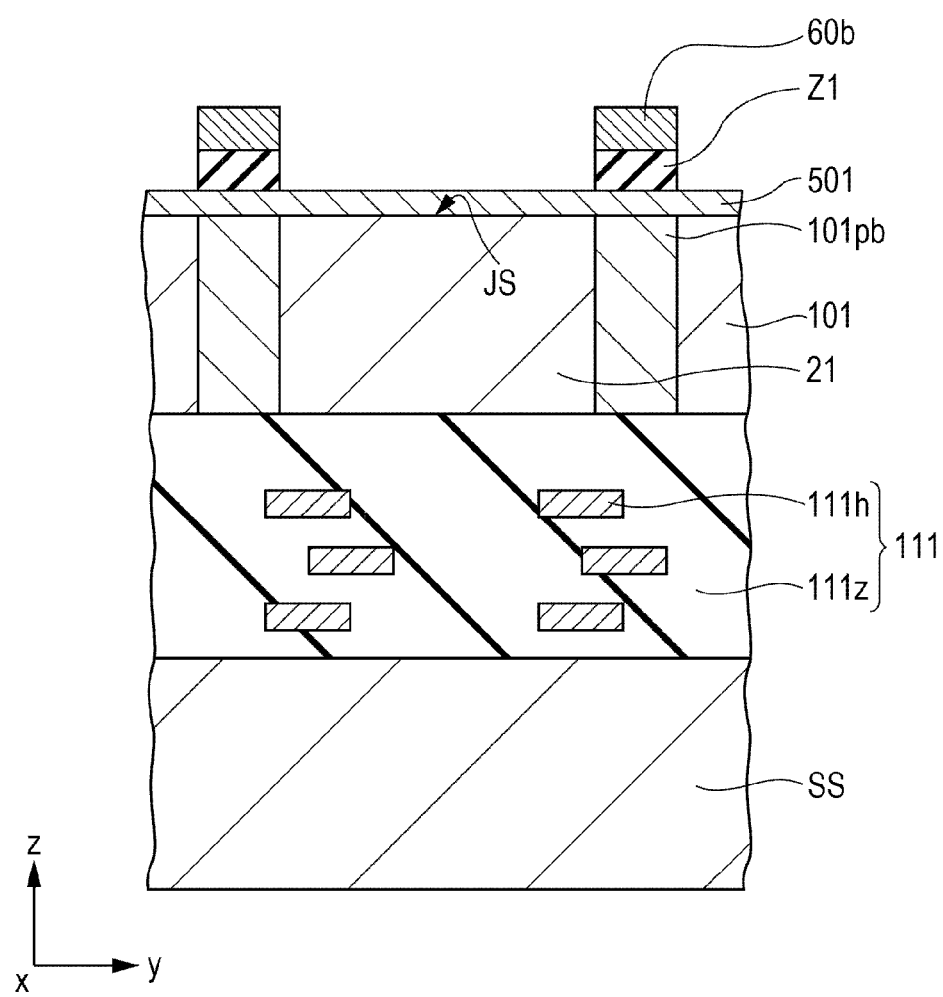
FIG. 12 is a diagram showing a method of manufacturing the solid-state imaging device in the second embodiment according to the present invention.
Figure 13:
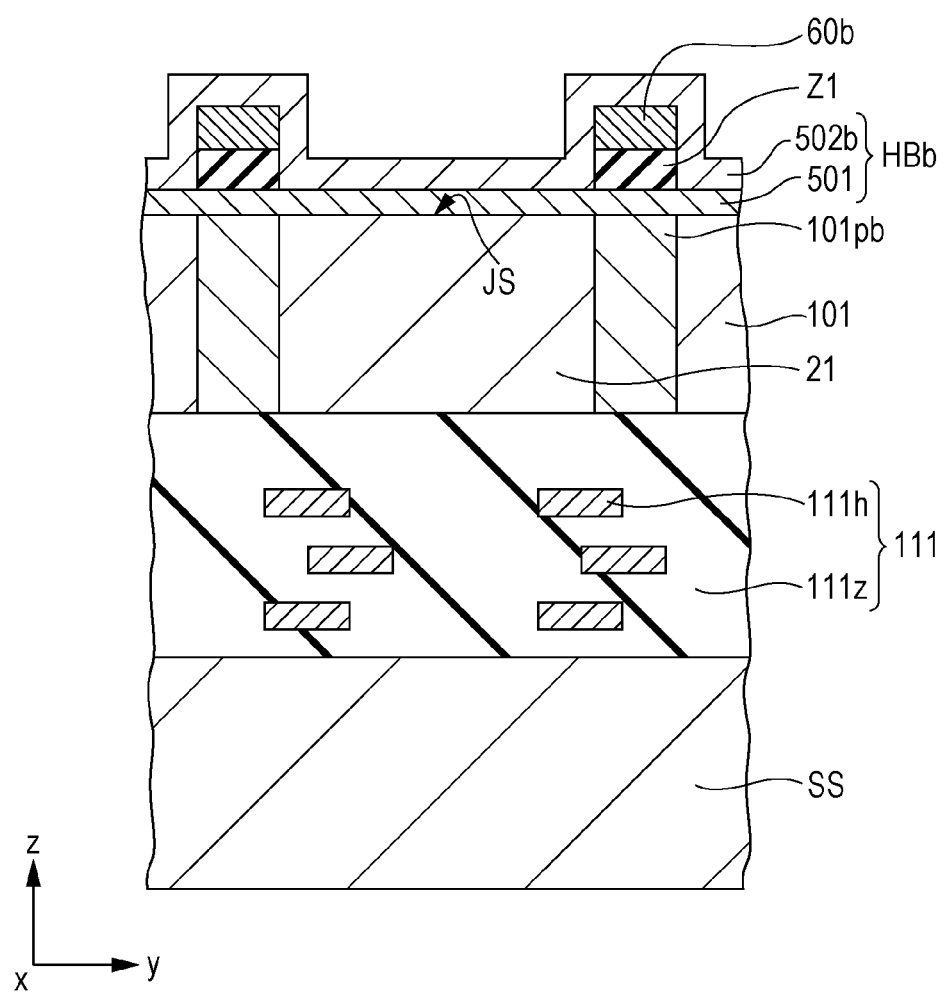
FIG. 13 is a diagram showing a method of manufacturing the solid-state imaging device in the second embodiment according to the present invention.
Figure 14:
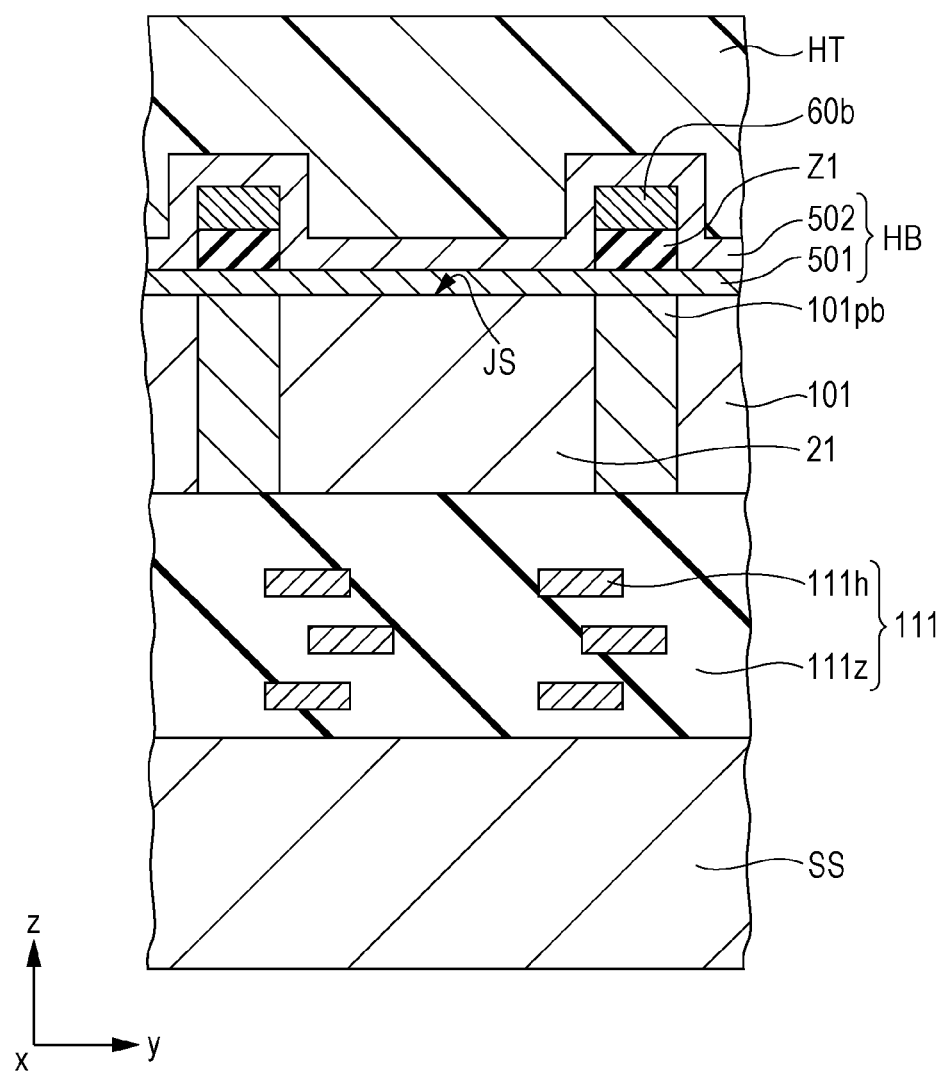
FIG. 14 is a diagram showing a method of manufacturing the solid-state imaging device in the second embodiment according to the present invention.

FIGS. 12 to 14 are diagrams showing a method of manufacturing a solid-state imaging device 1*b* in a second embodiment according to the present invention.

Similarly to FIG. 11, FIGS. 12 to 14 show cross-sections, and the solid-state imaging device shown in FIG. 11 is manufactured sequentially via each process shown in FIGS. 12 to 14.

Even in the case of the present embodiment, similarly to the first embodiment, as shown in FIGS. 6 and 7, the formation of the photodiode 21 or the like and the formation of the first antireflection film 501 are carried out.

(2-1) Formation of the Insulation Film Z1 and the Light Shielding Layer 60*b*

Next, as shown in FIG. 12, the insulation film Z1 and the light shielding layer 60*b* are formed.

Herein, as shown in FIG. 12, the insulation film Z1 and the light shielding layer 60 are formed on the upper surface of the first antireflection film 501 so as to be situated at the upper part of the pixel separation portion 101*pb* provided in the inner portion of the semiconductor layer 101.

For example, the silicon oxide film is formed on the upper surface of the first antireflection film 501 by the plasma CVD method to have a film thickness of 10 to 50 nm. Next, for example, the titanium (Ti) film is formed on the upper surface of the silicon oxide film as the close-contact layer to have a film thickness of 10 to 50 nm by the sputtering method. Then, the tungsten (W) film as the light shielding layer is formed to have the thickness of 100 to 400 nm.

In addition, by performing the pattern working in regard to each of the silicon oxide film and the tungsten and titanium film, the insulation film Z1 and the light shielding layer 60*b* are formed. Specifically, by performing the dry etching process with respect to the silicon oxide film, the insulation film Z is subjected to the pattern working. Furthermore, by performing the dry etching process with respect to the tungsten and titanium film, the light shielding layer 60*b* is subjected to the pattern working.

(2-2) Formation of Second Antireflection Film 502

Next, as shown in FIG. 13, the second antireflection film 502 is formed.

Herein, as shown in FIG. 13, the second antireflection film 502 is formed so as to cover the upper surface of the first antireflection film 501 on which the insulation film Z1 and the light shielding layer 60*b* are formed.

For example, similarly to the case of the first embodiment, by forming the hafnium oxide film (HfO$_2$ film) by the physical vapor deposition (PVD) method, the second antireflection film 502 is formed.

As a result, the second antireflection film 502 is formed so that only the first antireflection film 501 is interposed in the formation portion of the photodiode 21 and the first antireflection film 501, the insulation film Z1, and the light shielding layer 60*b* are interposed in the formation portion of the pixel separation portion 101*pb*.

(2-3) Formation of the Planarization Film HT

Next, as shown in FIG. 14, the planarization film HT is formed.

Herein, as shown in FIG. 14, the planarization film HT is formed so that the upper surface thereof is flat on the second antireflection film 502, similarly to the case of the first embodiment.

Next, as shown in FIG. 11, at the rear surface side of the semiconductor layer 101, the color filter CF and the micro lens ML are provided. By doing this, a rear surface irradiation type of CMOS type image sensor is completed.

(3) Conclusion

In the present embodiment, similarly to the case of the first embodiment, only the thin first antireflection film 501 is provided between the semiconductor layer 101 and the light shielding layer 60*b* (see FIG. 11).

Thus, it is possible to prevent the "mixed color" from occurring to improve color reproducibility in the captured color image.

Moreover, in the present embodiment, unlike the case of the first embodiment, the insulation film Z1 is provided between the first antireflection film 501 and the light shielding layer 60*b* (see FIG. 11).

For this reason, in the present embodiment, the reaction between the first antireflection film 501 and the light shielding layer 60*b* is prevented. Thus, even in a case where a material such as titanium having the strong reduction action is used for the light shielding layer 60*b* to improve the close-contact property, by the action of the negative fixed electric charge included in the first antireflection film 501, occurrence of the dark current caused by the interface state can be effectively suppressed.

Thus, the present embodiment can improve the image quality.

In addition, besides the above, in a case where the first antireflection film 501 and the light shielding layer 60*b* are formed by the combination of the materials as follows, similarly to the case of the present embodiment, it is desirable to provide the insulation film Z1 as the intermediate layer.

(The material of the first antireflection film 501 and the material of the light shielding layer 60*b*)=(HfO$_2$, Ti), (Al$_2$O$_3$, Ti), (ZrO$_2$, Ti)

3. Third Embodiment (1) Device Configuration or the Like

Figure 15:
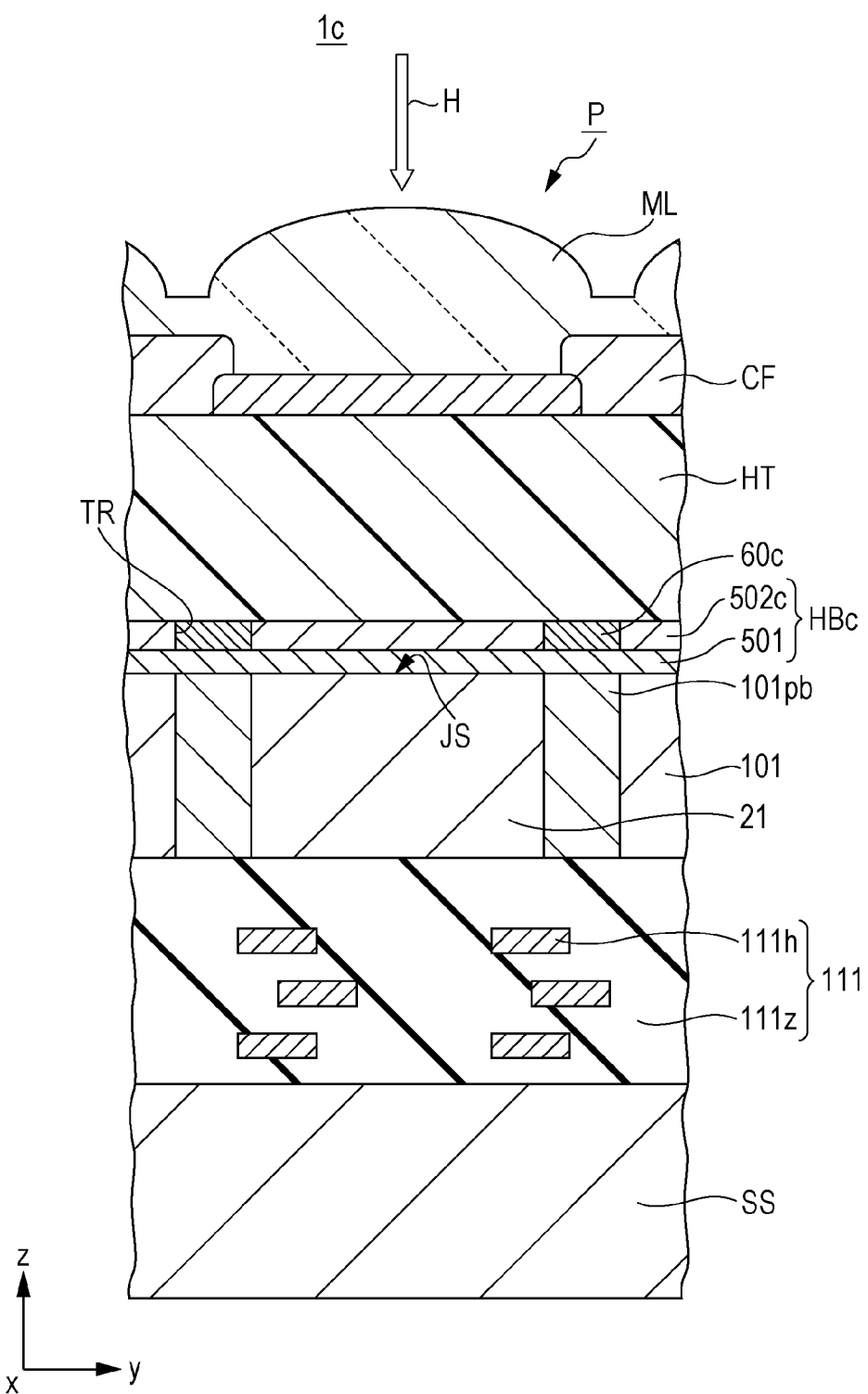
FIG. 15 is a diagram showing a principal part of a solid-state imaging device in a third embodiment according to the present invention.

FIG. 15 is a diagram showing a principal part of a solid-state imaging device 1*c* in a third embodiment according to the present invention.

FIG. 15 shows the cross-section of the pixel P similarly to FIG. 3.

As shown in FIG. 15, in the present embodiment, the configurations of an antireflection film 50*c* and a light shielding layer 60*c* are different from those of the first embodiment. Besides this point, the present invention is the same as the first embodiment. For this reason, descriptions of the overlapped portions will be omitted.

(a) Antireflection Film 50*c*

As shown in FIG. 15, similarly to the case of the first embodiment, the antireflection film 50*c* includes a plurality of films of a first antireflection film 501 and a second antireflection film 502*c*.

In the antireflection film 50*c*, similarly to the case of the first embodiment, the first antireflection film 501 is provided on the rear surface (the upper surface in FIG. 15) of the semiconductor layer 101. In addition, as shown in FIG. 15, the second antireflection film 502*c* is provided so that the first antireflection film 501 is interposed in the portion where the photodiode 21 is formed on the rear surface of the semiconductor layer 101.

However, in the portion where the pixel separation portion 101pb is formed on the rear surface of the semiconductor layer 101, unlike the case of the first embodiment, the second antireflection film 502c is not provided.

(b) Light Shielding Layer 60c

As shown in FIG. 15, similarly to the first embodiment, the light shielding layer 60c is formed in the portion where the pixel separation portion 101pb is provided in the semiconductor layer 101 among the upper surface of the first antireflection film 501. However, the second antireflection film 502c is not provided so as to cover the light shielding layer 60c.

(c) The Rest (Manufacturing Method or the Like)

In the present embodiment, after forming the first antireflection film 501 and before forming the light shielding layer 60c, the second antireflection film 502c is formed. Herein, by forming a material film for forming the second antireflection film 502c is formed on the upper surface of the first antireflection film 501 and then performing the pattern working of the material film, the second antireflection film 502c is formed. That is, by etching the material film for forming the second antireflection film 502c so that the front surface of the portion where the light shielding layer 60c is formed is exposed among the upper surface of the first antireflection film 501 to form a groove TR, the second antireflection film 502c is formed.

Next, the material film for forming the light shielding layer 60c is formed on the second antireflection film 502c so as to embed the inner portion of the groove TR. In addition, by performing the planarization process so that the upper surface of the second antireflection film 502c is exposed, the light shielding layer 60c is formed.

The respective portions are formed as above to complete the solid-state imaging device 1c.

In the present embodiment, in order to form the respective portions as above, it is desirable to form the first antireflection film 501 and the second antireflection film 502c by a material in which the etching selection ratio between them becomes larger. Moreover, it is desirable to form the light shielding layer 60c by a material that can be easily embedded in the groove TR.

(2) Conclusion

In the present embodiment, similarly to the case of the first embodiment, only the thin first antireflection film 501 is formed between the semiconductor layer 101 and the light shielding layer 60c (see FIG. 15).

Thus, it is possible to prevent the occurrence of the "mixed color" to improve color reproducibility in the captured color image.

In the present embodiment, unlike the case of the first embodiment, the second antireflection film 502 is not formed so as to cover the upper surface of the light shielding layer 60c. The light shielding layer 60c is formed so as to be buried in the groove TR provided in the second antireflection film 502 (see FIG. 15).

For this reason, in the present embodiment, the front surfaces of the light shielding layer 60c and the second antireflection film 502 are flat (see FIG. 15). Thus, the planarization film HT to be stacked on the upper layer can be thinned and the intensity of the light H incident to the light sensing surface JS can be improved, so that high sensitivity can be realized.

Thus, the present embodiment can improve the image quality.

4. Fourth Embodiment (1) Device Configuration or the Like

Figure 16:
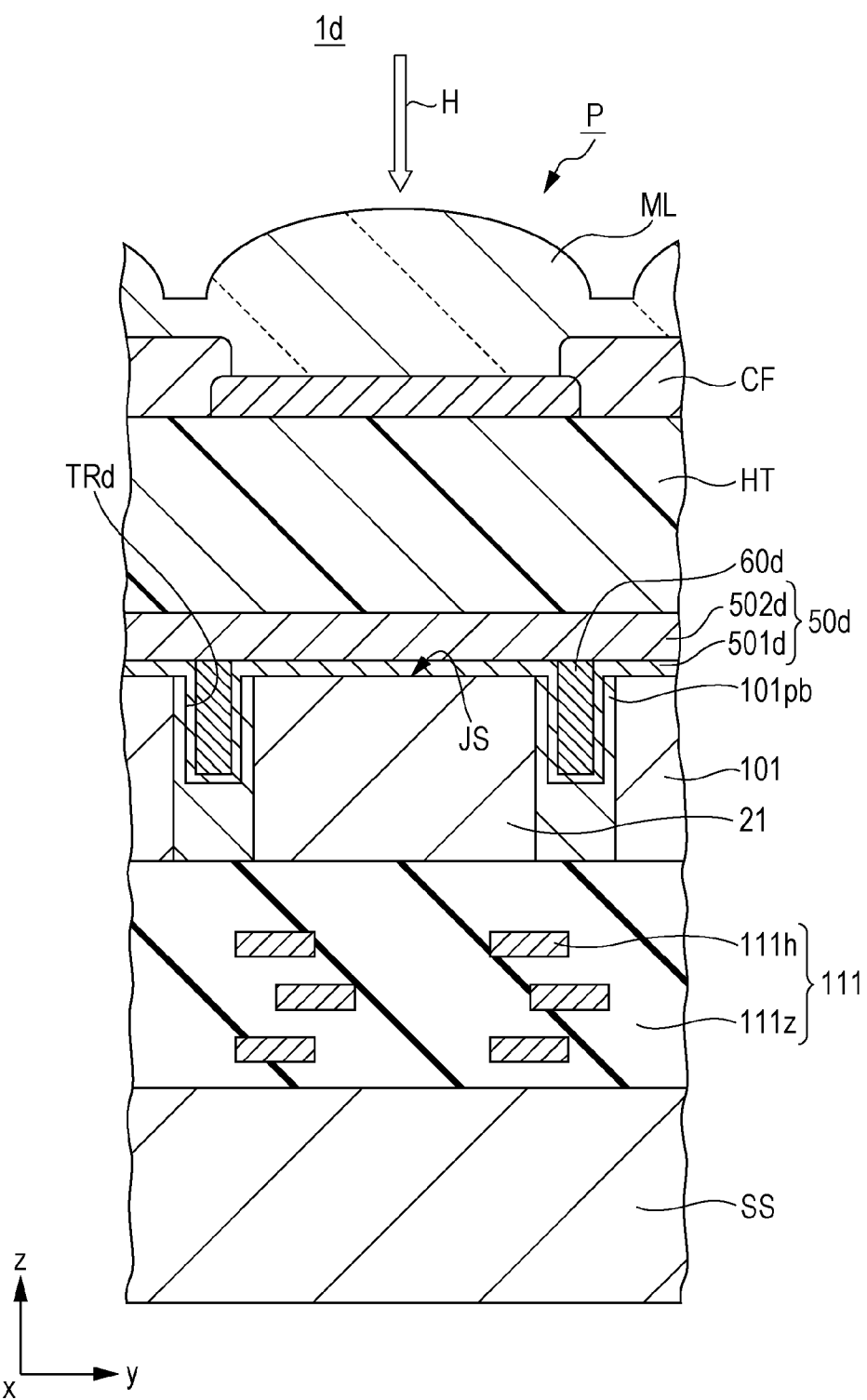
FIG. 16 is a diagram showing a principal part of a solid-state imaging device in a fourth embodiment according to the present invention.

FIG. 16 is a diagram showing a principal part of a solid-state imaging device 1d in a fourth embodiment according to the present invention.

FIG. 16 shows the cross-section of the pixel P, similarly to FIG. 3.

As shown in FIG. 16, in the present embodiment, the configurations of an antireflection film 50d and a light shielding layer 60d are different from those of the first embodiment. Besides this point, the present invention is the same as the first embodiment. For this reason, descriptions of the overlapped portions will be omitted.

(a) Antireflection Film 50d

As shown in FIG. 16, similarly to the case of the first embodiment, the antireflection film 50d includes a plurality of films of a first antireflection film 501d and a second antireflection film 502d.

As shown in FIG. 16, in the antireflection film 50d, similarly to the first embodiment, the first antireflection film 501d is provided so as to cover the rear surface (the upper surface) side of the semiconductor layer 101. That is, the first antireflection film 501d is provided so as to cover the portion where the photodiode 21 is formed and the portion where the pixel separation portion 101pb is formed in the rear surface side of the semiconductor layer 101.

However, in the present embodiment, unlike the first embodiment, the rear surface side of the semiconductor layer 101 is not flat but has a groove TRd provided therein and becomes a concave and convex surface, and the first antireflection film 501d is formed in a regular thickness so as to cover the concave and convex surfaces.

In the antireflection film 50d, as shown in FIG. 16, the second antireflection film 502d is provided so as to cover the rear surface (the upper surface) of the semiconductor layer 101 via at least one of the first antireflection film 501d and the light shielding layer 60d.

Specifically, as shown in FIG. 16, in the portion where the photodiode 21 is formed on the rear surface of the semiconductor layer 101, similarly to the first embodiment, the second antireflection film 502d is provided so that the first antireflection film 501d is interposed between it and the semiconductor layer 101.

Furthermore, in the portion where the pixel separation portion 101pb is formed on the rear surface of the semiconductor layer 101, the second antireflection film 502 is provided so that both of the first antireflection film 501d and the light shielding layer 60d are interposed between it and the semiconductor layer 101.

In the present embodiment, as shown in FIG. 16, unlike the first embodiment, the rear surface side of the semiconductor layer 101 has the groove TRd provided therein, the first antireflection film 501d covers the surface of the groove TRd, and the light shielding layer 60d is provided in the inner portion of the groove TRd. For this reason, the second antireflection film 502d is provided on the upper surface of the first antireflection film 501d so as to interpose the light shielding layer 60d thus formed therebetween. That is, the second antireflection film 502d is formed in the regular thickness so as to follow the flat surface on which the first antireflection film 501d and the light shielding layer 60d are provided.

(b) Light Shielding Layer 60*d*

As shown in FIG. 16, the light shielding layer 60*d* is provided at the upper part of the pixel separation portion 101*pb* provided in the inner portion of the semiconductor layer 101.

In the present embodiment, as shown in FIG. 16, the groove TRd is provided in the portion where the pixel separation portion 101*pb* is provided on the rear surface side of the semiconductor layer 101, and the first antireflection film 501*d* is provided so as to cover the surface of the groove TRd. In addition, the light shielding layer 60*d* is provided so as to be buried in the inner portion of the groove TRd covered with the first antireflection film 501*d*.

In addition, the upper surface of the light shielding layer 60*d* is covered with the second antireflection film 502*d*.

(c) The Rest (Manufacturing Method or the Like)

In the present embodiment, before forming the first antireflection film 501, the groove TRd is formed in the portion where the pixel separation portion 101*pb* is provided in the rear surface side of the semiconductor layer 101. In addition, the first antireflection film 501 is formed on the rear surface of the semiconductor layer 101 so as to cover the groove TRd.

Next, the material film for forming the light shielding layer 60*d* is formed on the first antireflection film 501*d* so as to bury the inner portion of the groove TR. In addition, by performing the planarization process so that the upper surface of the first antireflection film 501*d* is exposed, the light shielding layer 60*d* is formed.

The second antireflection film 502*d* is formed so as to cover the first antireflection film 501*d* and the light shielding layer 60*d*.

The respective portions are formed as above to complete the solid-state imaging device 1*d*.

(2) Conclusion

In the present embodiment, the light shielding layer 60*d* is provided in the inner portion of the groove TRd provided in the formation portion of the pixel separation portion 101*pb* (see FIG. 16).

For this reason, the light shielding layer 60*d* can shield the light that is incident from the pixel P to the photodiode 21 of the adjacent different pixel P. Thus, it is possible to prevent the occurrence of the "mixed color" to improve the color reproducibility in the captured color image.

In the present embodiment, the front surface of the semiconductor layer 101 is flat, and thus, the planarization film HT to be stacked on the upper part thereof can be thinned and the intensity of the light H incident to the light sensing surface JS can be improved. Thus, high sensitivity can be realized.

Upon carrying out the present invention, various modified examples can be adopted without being limited to the above-mentioned embodiments.

For example, although, in the above-mentioned embodiment, the case where the antireflection film 50 is constituted by two films has been described, the present invention is not limited thereto. If it is configured so that the antireflection film 50 includes the first antireflection portion covering the formation portion of the light sensing surface and the light shielding surface, and the second antireflection portion covering the formation portion of the light sensing portion JS on the first antireflection portion, among the surfaces to which the incident light is incident, the number of the films is not limited.

In the above-mentioned embodiments, the case of the "rear surface irradiation type" has been described, but the present invention is not limited thereto. The present invention may be applied to the case of the "front surface irradiation type".

In the above-mentioned embodiment, the case where four types of the transmission transistor, the amplification transistor, the selection transistor, and the reset transistor are provided as the pixel transistor has been described, but the present invention is not limited thereto. For example, the present invention may be applied to a case where three types of the transmission transistor, the amplification transistor, and the reset transistor are provided as the pixel transistor.

In the above-mentioned embodiment, the description has been given of the case where one transmission transistor, one amplification transistor, one selection transistor, and one reset transistor are provided with respect to one photodiode, but the present invention is not limited thereto. For example, the present invention may be applied to the case where one amplification transistor, one selection transistor, and one reset transistor are provided with respect to a plurality of photodiodes.

Furthermore, in the above-mentioned embodiments, the description has been given of the case where the present invention is applied to a camera, but the present invention is not limited thereto. The present invention may be applied to other electronic equipment including a solid-state imaging device such as a scanner or a copier.

In addition, in the above-mentioned embodiments, the solid-state imaging devices 1, 1*b*, 1*c* and 1*d* correspond to the solid-state imaging device of the present invention. Moreover, in the above-mentioned embodiments, the photodiode 21 corresponds to the photoelectric conversion portion of the present invention. In the above-mentioned embodiments, the camera 40 corresponds to the electronic equipment of the present invention. In the above-mentioned embodiments, the semiconductor layer 101 corresponds to the semiconductor layer of the present invention. In the above-mentioned embodiments, the antireflection films 50, 50*c* and 50*d* correspond to the antireflection film of the present invention. In the above-mentioned embodiments, the first antireflection films 501 and 501*d* correspond to the first antireflection portion of the present invention. In the above-mentioned embodiments, the second antireflection films 502, 502*c* and 502*d* correspond to the second antireflection portion of the present invention. In the above-mentioned embodiments, the light shielding layers 60, 60*b*, 60*c* and 60*d* correspond to the light shielding layer of the present invention. In the above-mentioned embodiments, the light sensing surface JS corresponds to the light sensing surface of the present invention. In the above-mentioned embodiments, the pixel P corresponds to the pixel of the present invention. In the above-mentioned embodiments, the insulation layer Z1 corresponds to the intermediate layer of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
 a semiconductor substrate including:
  a first groove portion provided between adjacent photoelectric conversion elements; and
  a second groove portion provided adjacent to the first groove portion;

an hafnium oxide film disposed, at least in part, in the first groove portion and the second groove portion, wherein the hafnium oxide film extends from the first groove portion to the second groove portion along a light-incident side of the semiconductor substrate; and a tantalum oxide film disposed at a light-incident side of at least a portion of the hafnium oxide film between the first groove portion and the second groove portion.

2. The imaging device according to claim 1, further comprising:

a pixel separation portion disposed in the semiconductor substrate that includes a first pixel separation portion and a second pixel separation portion, wherein the first pixel separation portion includes the first groove portion and the second pixel separation portion includes the second groove portion.

3. The imaging device according to claim 2, further comprising:

a light-shielding portion disposed corresponding to the pixel separation portion.

4. The imaging device according to claim 3, wherein the light-shielding portion is surrounded by the hafnium oxide film and the tantalum oxide film.

5. The imaging device according to claim 3, wherein a thickness of the light shielding-portion is 100-400 µm.

6. The imaging device according to claim 1, further comprising:

a wiring layer disposed at an opposite side of the semiconductor substrate to the light-incident side.

7. The imaging device according to claim 6, further comprising:

a second substrate bonded to the wiring layer.

8. The imaging device according to claim 1, further comprising:

a planarization film disposed at the light-incident side of the semiconductor substrate.

9. The imaging device according to claim 8, further comprising:

a color filter disposed over the planarization film including: a first color filter, a second color filter disposed adjacent to the first color filter, and a third color filter disposed adjacent to the second color filter.

10. The imaging device according to claim 9, wherein the first groove portion
is disposed at a boundary of the first color filter and the second color filter, and the second groove portion is disposed at a boundary of the second color filter and the third color filter.

11. The imaging device according to claim 9, further comprising:

a micro lens disposed over the color filter.

12. The imaging device according to claim 1, wherein a thickness of the hafnium oxide film is thicker than a thickness of the tantalum oxide film.

13. The imaging device according to claim 1, wherein a thickness of the hafnium oxide film is 1-20 nm.

14. The imaging device according to claim 1, wherein a total thickness of the hafnium oxide film and the tantalum oxide film is 40-80 nm.

15. The imaging device according to claim 1, wherein a thickness of the semiconductor substrate is 10-20 µm.

16. An imaging device, comprising:

a semiconductor substrate having a first side that receives light, and a second side opposite to the first side;

a photoelectric conversion region disposed in the semiconductor substrate;

a hafnium oxide film disposed above the first side of the semiconductor substrate;

a light-shielding portion comprising a first film including titanium and a second film including tungsten, the second film disposed above the first film;

a silicon oxide film disposed between the hafnium oxide film and the first film;

a third film including silicon and oxygen disposed above the light-shielding portion; and a wiring layer disposed on the second side of the semiconductor substrate.

17. The imaging device according to claim 16, further comprising:

a pixel transistor in the wiring layer.

18. The imaging device according to claim 16, wherein the third film contacts the second film at a side of the second film opposite from the first film.

19. The imaging device according to claim 16, further comprising:

a planarization film disposed at the first side of the semiconductor substrate; and a color filter disposed over the planarization film including: a first color filter, a second color filter disposed adjacent to the first color filter, and a third color filter disposed adjacent to the second color filter.

20. The imaging device according to claim 16, wherein the first film and the second film correspond to a groove in the semiconductor substrate that is adjacent to the photoelectric conversion region.

* * * * *